(12) United States Patent
Min et al.

(10) Patent No.: US 12,727,353 B2
(45) Date of Patent: Sep. 1, 2026

(54) DISPLAY DEVICE GATE WIRING AND FANOUT WIRING CONFIGURATIONS

(71) Applicant: SAMSUNG DISPLAY CO., LTD., Yongin-si (KR)

(72) Inventors: Junyoung Min, Yongin-si (KR); Wonkyu Kwak, Yongin-si (KR); Huigyeong Yun, Yongin-si (KR); Junwon Choi, Yongin-si (KR); Jihyun Ka, Yongin-si (KR); Yangwan Kim, Yongin-si (KR); Myeonghee Seo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 670 days.

(21) Appl. No.: 18/159,635

(22) Filed: Jan. 25, 2023

(65) Prior Publication Data

US 2023/0240107 A1 Jul. 27, 2023

(30) Foreign Application Priority Data

Jan. 26, 2022 (KR) ........................ 10-2022-0011786

(51) Int. Cl.
*H10K 59/131* (2023.01)
*H10K 59/124* (2023.01)

(52) U.S. Cl.
CPC ....... *H10K 59/1315* (2023.02); *H10K 59/124* (2023.02)

(58) Field of Classification Search
CPC ......................... H10K 59/1315; H10K 59/124
USPC ................................ 257/40, 59, 91, 99, 100
See application file for complete search history.

(56) References Cited

U.S. PATENT DOCUMENTS

| | | | |
|---|---|---|---|
| 8,198,191 | B2 | 6/2012 | Cho et al. |
| 8,907,327 | B2 | 12/2014 | Kim et al. |
| 8,975,761 | B2 | 3/2015 | Jung |
| 9,136,047 | B2 | 9/2015 | Song et al. |
| 9,425,434 | B2 | 8/2016 | Lee et al. |

(Continued)

FOREIGN PATENT DOCUMENTS

| | | |
|---|---|---|
| KR | 100807948 B1 | 2/2008 |
| KR | 100841170 B1 | 6/2008 |

(Continued)

*Primary Examiner* — Eric W Jones
(74) *Attorney, Agent, or Firm* — CANTOR COLBURN LLP

(57) ABSTRACT

A display device includes: a substrate including a display area and a non-display area including a pad area; an inorganic insulating layer disposed on the substrate and including a first inorganic insulating layer, a second inorganic insulating layer, and a third inorganic insulating layer; a light-emitting element layer disposed on the inorganic insulating layer and including a light-emitting element overlapping the display area in a plan view; a gate wiring overlapping the display area in the plan view, extending in a first direction and disposed between the first inorganic insulating layer and the second inorganic insulating layer; and a fanout wiring extending in a direction toward the display area from the pad area and disposed between the second inorganic insulating layer and the third inorganic insulating layer, where a sheet resistance of the gate wiring is lower than a sheet resistance of the fanout wiring.

7 Claims, 15 Drawing Sheets

(56) References Cited

U.S. PATENT DOCUMENTS

| | | | | |
|---|---|---|---|---|
| 9,660,011 | B2 | 5/2017 | Kim et al. | |
| 9,679,957 | B2 | 6/2017 | Kwon et al. | |
| 9,761,650 | B2 | 9/2017 | Kwon et al. | |
| 11,158,693 | B2 | 10/2021 | Chung et al. | |
| 11,355,568 | B2 | 6/2022 | Ka et al. | |
| 11,889,706 | B2 | 1/2024 | Kim et al. | |
| 2014/0117320 | A1* | 5/2014 | Jung | H10K 59/131 257/40 |
| 2014/0183476 | A1* | 7/2014 | Kwon | H10D 64/62 257/43 |
| 2015/0380474 | A1* | 12/2015 | Lee | H10K 59/875 257/40 |
| 2016/0377904 | A1* | 12/2016 | Shin | G02F 1/136286 257/776 |
| 2017/0262109 | A1 | 9/2017 | Choi et al. | |
| 2017/0301739 | A1* | 10/2017 | Park | H10K 59/127 |
| 2019/0095007 | A1 | 3/2019 | Jeong et al. | |
| 2019/0165079 | A1* | 5/2019 | Cho | H10K 59/8722 |
| 2020/0058725 | A1* | 2/2020 | Ka | H10K 59/131 |
| 2020/0111854 | A1* | 4/2020 | Chung | H10D 86/481 |
| 2021/0111238 | A1 | 4/2021 | Kim et al. | |
| 2021/0320165 | A1 | 10/2021 | So et al. | |
| 2021/0399077 | A1 | 12/2021 | Eom et al. | |

FOREIGN PATENT DOCUMENTS

| | | | |
|---|---|---|---|
| KR | 1020140053626 | A | 5/2014 |
| KR | 1020140085305 | A | 7/2014 |
| KR | 1020160000980 | A | 1/2016 |
| KR | 1020160043574 | A | 4/2016 |
| KR | 1020160122892 | A | 10/2016 |
| KR | 1020170001815 | A | 1/2017 |
| KR | 1020170106621 | A | 9/2017 |
| KR | 1020190035995 | A | 4/2019 |
| KR | 102034050 | B1 | 10/2019 |
| KR | 1020200021569 | A | 3/2020 |
| KR | 1020200037027 | A | 4/2020 |
| KR | 1020200039067 | A | 4/2020 |
| KR | 1020210044362 | A | 4/2021 |
| KR | 1020210075943 | A | 6/2021 |
| KR | 1020210127276 | A | 10/2021 |
| KR | 1020210157926 | A | 12/2021 |

* cited by examiner

DISPLAY DEVICE GATE WIRING AND FANOUT WIRING CONFIGURATIONS

This application claims priority to Korean Patent Application No. 10-2022-0011786, filed on Jan. 26, 2022, and all the benefits accruing therefrom under 35 U.S.C. § 119, the content of which in its entirety is herein incorporated by reference.

BACKGROUND

1. Field

One or more embodiments relate to a display device.

2. Description of the Related Art

Display devices display data visually. These display devices are used as displays for small products, such as mobile phones, or displays for large products, such as televisions (TVs). Also, the display devices may be used as displays for products such as personal computers (PCs), tablet PCs, or laptop computers.

A display device may include a light-emitting element that emits light to display an image to the outside, and a pixel circuit. The pixel circuit may be electrically connected to a signal line extending in a first direction or a second direction crossing the first direction, for example, a gate wiring, and may receive electrical signals. The light-emitting element may be electrically connected to the pixel circuit and may emit light in response to signals transmitted from the pixel circuit.

SUMMARY

One or more embodiments include a display device having enhanced display quality and high reliability.

According to one or more embodiments, a display device includes a substrate including a display area and a non-display area outside the display area, where the non-display area includes a pad area, an inorganic insulating layer disposed on the substrate and including a first inorganic insulating layer, a second inorganic insulating layer, and a third inorganic insulating layer, which are sequentially stacked one on another, a light-emitting element layer disposed on the inorganic insulating layer and a light-emitting element overlapping the display area in a plan view, a gate wiring overlapping the display area in the plan view, extending in a first direction and disposed between the first inorganic insulating layer and the second inorganic insulating layer, and a fanout wiring extending in a direction toward the display area from the pad area and disposed between the second inorganic insulating layer and the third inorganic insulating layer, where a sheet resistance of the gate wiring is lower than a sheet resistance of the fanout wiring.

In an embodiment, the sheet resistance of the gate wiring may be less than or equal to about a half of the sheet resistance of the fanout wiring.

In an embodiment, the gate wiring may include a first layer including aluminum and a second layer disposed on the first layer and including titanium, and the fanout wiring may include molybdenum.

In an embodiment, the gate wiring may further include a middle layer disposed between the first layer and the second layer and including titanium nitride.

In an embodiment, the display device may further include a semiconductor layer overlapping the display area in the plan view and disposed between the substrate and the first inorganic insulating layer, and a gate electrode overlapping the semiconductor layer in the plan view and disposed between the first inorganic insulating layer and the second inorganic insulating layer, and the gate wiring and the gate electrode may be integrally formed as a single unitary an indivisible part.

In an embodiment, the inorganic insulating layer may further include a fourth inorganic insulating layer disposed on the third inorganic insulating layer, and the display device may further include an additional fanout wiring disposed between the third inorganic insulating layer and the fourth inorganic insulating layer and including the same material as a material of the fanout wiring.

In an embodiment, the substrate may include a first edge extending in the first direction and a second edge extending in a second direction crossing the first direction, and a length of the first edge may be greater than a length of the second edge.

In an embodiment, the fanout wiring may include adjacent fanout wirings, and the adjacent fanout wirings may be disposed between the second inorganic insulating layer and the third inorganic insulating layer.

In an embodiment, the display device may further include a sealing substrate disposed on the light-emitting element, and a sealing member disposed between the substrate and the sealing substrate and surrounding the display area in the plan view, and the fanout wiring may extend while crossing the sealing member in the plan view, and a melting point of a material included in the fanout wiring may be higher than a melting point of a material included in the gate wiring.

In an embodiment, the display device may further include an encapsulation layer disposed on the light-emitting element layer and including an inorganic encapsulation layer and an organic encapsulation layer.

According to one or more embodiments, a display device includes a substrate including a display area and a non-display area outside the display area, where the non-display area includes a pad area, an inorganic insulating layer disposed on the substrate, a gate wiring overlapping the display area in a plan view, extending in a first direction and disposed inside the inorganic insulating layer, a fanout wiring extending in a direction toward the display area from the pad area in the plan view, disposed inside the inorganic insulating layer and including a different material from a material of the gate wiring, and a light-emitting element layer disposed on the inorganic insulating layer and overlapping the display area in the plan view, where a sheet resistance of the gate wiring is lower than a sheet resistance of the fanout wiring.

In an embodiment, the sheet resistance of the gate wiring may be less than or equal to about a half of the sheet resistance of the fanout wiring.

In an embodiment, the gate wiring may include at least one selected from titanium nitride and titanium and aluminum, and the fanout wiring may include molybdenum.

In an embodiment, the inorganic insulating layer may include a first inorganic insulating layer, a second inorganic insulating layer, and a third inorganic insulating layer, which are sequentially stacked one on another, and the gate wiring may be disposed between the first inorganic insulating layer and the second inorganic insulating layer, and the fanout wiring may be disposed between the second inorganic insulating layer and the third inorganic insulating layer.

In an embodiment, the inorganic insulating layer may further include a fourth inorganic insulating layer disposed on the third inorganic insulating layer, and the display device may further include an additional fanout wiring disposed between the third inorganic insulating layer and the fourth inorganic insulating layer and including a same material as a material of the fanout wiring.

In an embodiment, the inorganic insulating layer may further include a lower metal layer including a buffer layer, a first inorganic insulating layer, and a second inorganic insulating layer, which are sequentially stacked one on another, and the display device may further include a lower metal layer overlapping the display area in the plan view and disposed between the substrate and the buffer layer, and a semiconductor layer overlapping the lower metal layer in the plan view, disposed between the buffer layer and the first inorganic insulating layer and including an oxide semiconductor, and the gate wiring may be disposed between the first inorganic insulating layer and the second inorganic insulating layer, and the fanout wiring may be disposed between the substrate and the buffer layer.

In an embodiment, the substrate may include a first edge extending in the first direction and a second edge extending in a second direction crossing the first direction, and a length of the first edge may be greater than a length of the second edge.

In an embodiment, the fanout wiring may include adjacent fanout wirings, and the adjacent fanout wirings may be disposed in a same layer as each other.

In an embodiment, the display device may further include a sealing substrate disposed on the light-emitting element layer, and a sealing member disposed between the substrate and the sealing substrate and surrounding the display area in the plan view, where the fanout wiring may extend while crossing the sealing member in the plan view, and a melting point of a material included in the fanout wiring may be higher than a melting point of a material included in the gate wiring.

In an embodiment, the display device may further include an encapsulation layer disposed on the light-emitting element layer and including an inorganic encapsulation layer and an organic encapsulation layer.

BRIEF DESCRIPTION OF THE DRAWINGS

The above and other features of certain embodiments of the disclosure will be more apparent from the following description taken in conjunction with the accompanying drawings, in which:

FIG. 7 is a cross-sectional view schematically illustrating a display device taken along line D-D' of FIG. 5 and line E-E' of FIG. 6, according to an embodiment;

FIG. 9 is a cross-sectional view schematically illustrating a display device taken along line D-D' of FIG. 5 and line E-E' of FIG. 6, according to alternative embodiment;

FIG. 12 is a cross-sectional view schematically illustrating a display device taken along line G-G' and line H-H' of FIG. 11, according to an embodiment.

DETAILED DESCRIPTION

Figure 1:
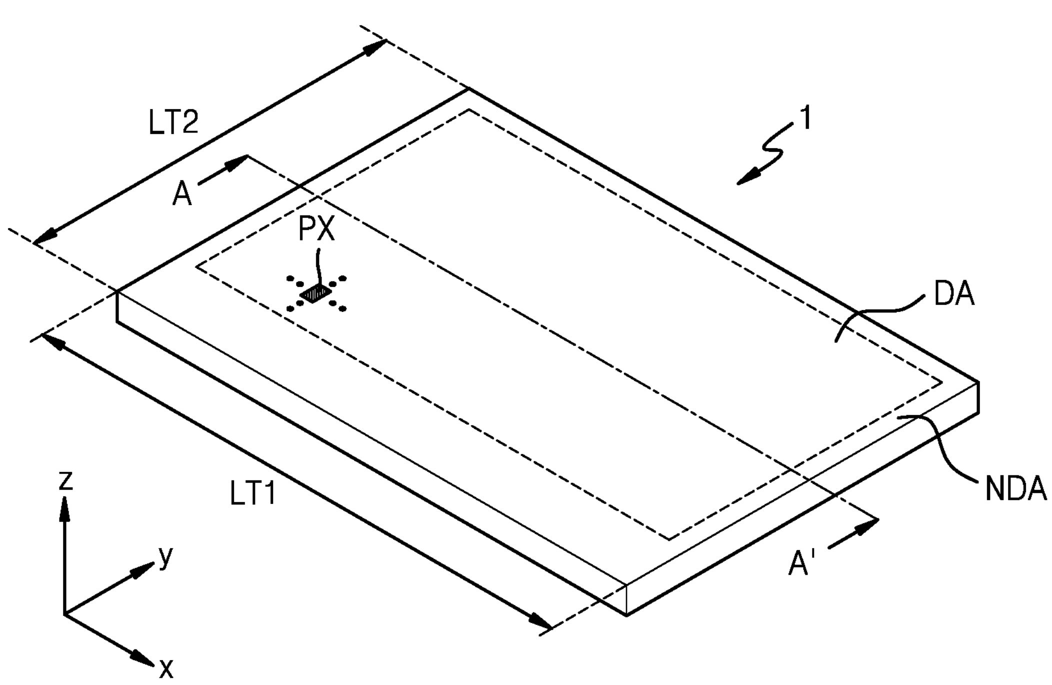
FIG. 1 is a perspective view schematically illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof.

Since various modifications and various embodiments of the present disclosure are possible, specific embodiments are illustrated in the drawings and described in detail in the detailed description. Effects and features of the present disclosure, and a method of achieving them will be apparent with reference to embodiments described below in detail in conjunction with the drawings. However, the present disclosure is not limited to the embodiments disclosed herein, but may be implemented in a variety of forms.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the following embodiments, when a portion such as a layer, a region, a component or the like is on other portions, this is not only when the portion is on other components, but also when other components are interposed therebetween.

In the drawings, for convenience of description, the sizes of components may be exaggerated or reduced. For example, since the size and thickness of each component shown in the drawings are arbitrarily indicated for convenience of description, the present disclosure is not necessarily limited to the illustration.

In the case where some embodiments may be differently implemented in this specification, a specific process order may be performed differently from the order described. For example, two processes described in succession may be substantially performed at the same time, or in an opposite order to an order to be described.

In the following embodiments, when a layer, a region, a component or the like is connected to other components, this is not only when a layer, a region, a component or the like is directly connected to each other or/and but also when a layer, a region, a component or the like is indirectly connected to each other while another layer, another region, another component or the like is interposed therebetween. For example, in this specification, when a layer, a region, a component or the like is electrically connected to each other, this is not only when a layer, a region, a component or the like is directly electrically connected to each other and/or but also when a layer, a region and a component or the like is indirectly electrically connected to each other while another layer, another region, another component or the like is interposed therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described in detail with reference to the accompanying drawings, and the same or corresponding components are denoted by the same reference numerals, and the same reference numerals are assigned and any repetitive detailed description thereof may be omitted or simplified.

FIG. 1 is a perspective view schematically illustrating a display device 1 according to an embodiment.

Referring to FIG. 1, an embodiment of the display device 1 may display an image. The display device 1 may include a display area DA and a non-display area NDA. Pixels PX may be arranged (or disposed) in the display area DA. The non-display area NDA may surround at least a portion of the display area DA. Pixels PX may not be arranged in the non-display area NDA.

In an embodiment, as shown in FIG. 1, the display area DA of the display device 1 may have a rectangular shape. However, in an alternative embodiment, the display area DA may be a polygon such as a circular, ellipse, or a triangular or pentagon. In an embodiment, as shown in FIG. 1, the display device 1 may be a flat panel display device, however, the display device 1 may be implemented in various forms such as flexible, foldable, or rollable display devices.

A plurality of pixels PX may be arranged in the display area DA. The plurality of pixels PX may emit light, and the display device 1 may display an image in the display area DA. In an embodiment, one of the plurality of pixels PX may emit red light, green light, or blue light. In an alternative embodiment, one of the plurality of pixels PX may emit red light, green light, blue light, or white light.

In an embodiment, a first length LT1 in a first direction of the display device 1 may be greater than a second length LT2 in a second direction of the display device 1. The number of the plurality of pixels PX arranged in the first direction may be greater than the number of the plurality of pixels PX arranged in the second direction. The first direction and the second direction may cross each other. In an embodiment, for example, the first direction and the second direction may be orthogonal to each other. The first direction may be an x-direction (or an x-axis direction), and the second direction may be a y-direction (or y-axis direction). In an alternative embodiment, for example, the first direction and the second direction may be an acute angle or an obtuse angle in each other. Hereinafter, embodiments where the first direction and the second direction are orthogonal to each other, will be described in detail. Here, a third direction (i.e., z-direction or z-axis direction) may be perpendicular to a plane defined by the first and second directions, or may be a thickness direction of the display device 1.

In an alternative embodiment, the first length LT1 may be less than the second length LT2. In another alternative embodiment, the first length LT1 and the second length LT2 may be the same to each other.

Figure 2A:
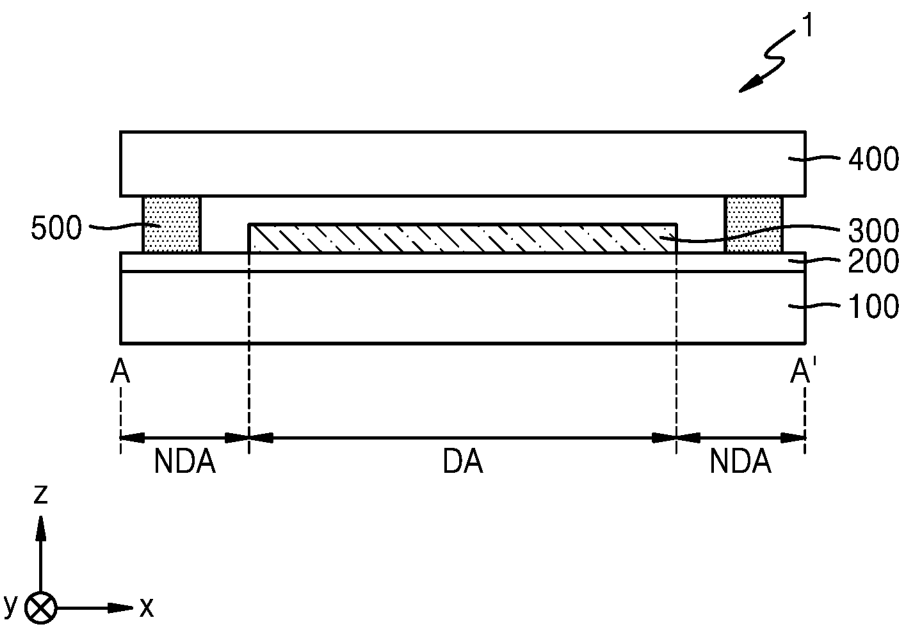
FIGS. 2A and 2B are cross-sectional views schematically illustrating the display device of FIG. 1 taken along line A-A' according to an embodiment, respectively.
Figure 2B:
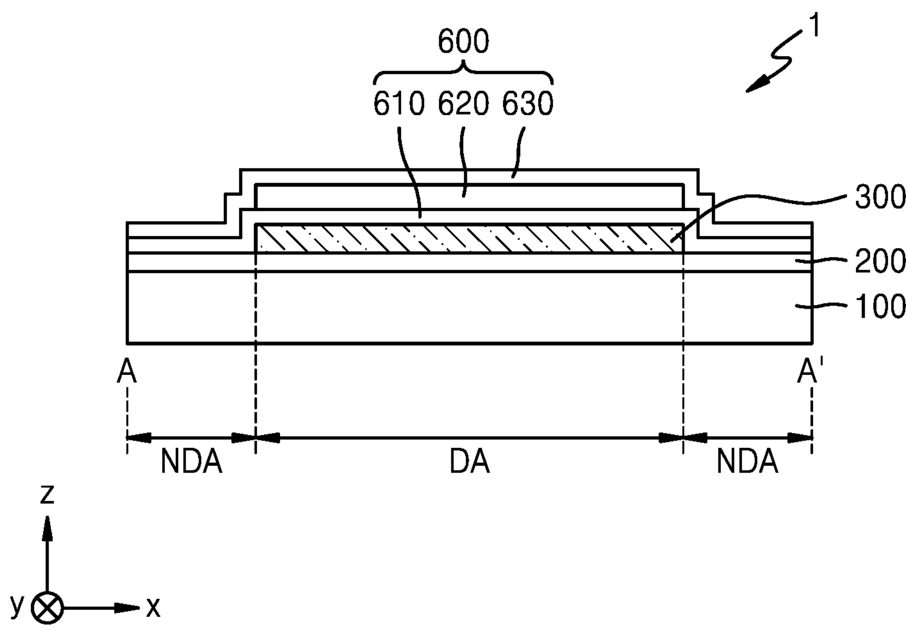

FIGS. 2A and 2B are cross-sectional views schematically illustrating the display device 1 of FIG. 1 taken along line A-A' according to an embodiment, respectively.

Referring to FIGS. 2A and 2B, an embodiment of the display device 1 may include a substrate 100, an inorganic insulating layer 200, a light-emitting element layer 300, and a sealing structure. The display device 1 may include a display area DA and a non-display area NDA. The display area DA and the non-display area NDA may be defined in the substrate 100. In such an embodiment, the substrate 100 may include the display area DA and the non-display area NDA.

In an embodiment, the substrate 100 may include glass. In an alternative embodiment, the substrate 100 may include a polymer resin such as polyethersulfone, polyarylate, polyetherimide, polyethylene naphthalate, polyethylene terephthalate, polyphenylene sulfide, polyimide, polycarbonate, cellulose trietate, or cellulose acetate propionate. In an embodiment, the substrate 100 may have a multi-layered structure including a base layer including the above-described polymer resin and a barrier layer (not shown). Hereinafter, embodiments where the substrate 100 includes glass, will be described in detail.

The inorganic insulating layer 200 may be arranged (or disposed) on the substrate 100. The inorganic insulating layer 200 may overlap the display area DA and the non-display area NDA. In this specification, the meaning of that a first component and a second component overlap each other is that the first component and the second component overlap each other in a plan view (e.g., a view in a x-y plane) or in the third direction. The inorganic insulating layer 200 may include at least one inorganic material selected from aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). In an embodiment, zinc oxide ($ZnO_x$) may be zinc oxide (ZnO) and peroxide ($ZnO_2$).

The light-emitting element layer 300 may be arranged on the inorganic insulating layer 200. The light-emitting element layer 300 may overlap the display area DA. The light-emitting element layer 300 may include a light-emitting element. The light-emitting element may be an organic light-emitting diode including an organic light-emitting layer. Alternatively, the light-emitting element may be a light-emitting diode (LED) including an inorganic light-emitting layer. The size of the LED may be micro scale or nano scale. In an embodiment, for example, the LED may be a micro LED. Alternatively, the LED may be a nanorod LED. The nanorod LED may include gallium nitride (GaN). In an embodiment, a color conversion layer may be arranged on the nanorod LED. The color conversion layer may include quantum dots. Alternatively, the light-emitting element may be a quantum dot LED including a quantum dot light-emitting layer.

Referring to FIG. 2A, in an embodiment, the sealing structure may include a sealing substrate 400 and a sealing member 500. The sealing substrate 400 may be arranged on the light-emitting element layer 300. In such an embodiment, the light-emitting element layer 300 may be arranged between the substrate 100 and the sealing substrate 400. The sealing substrate 400 may be a transparent member. In an embodiment, the sealing substrate 400 may include glass.

The sealing member 500 may be arranged between the substrate 100 and the sealing substrate 400. In an embodiment, the sealing member 500 may be arranged between the inorganic insulating layer 200 and the sealing substrate 400. The sealing member 500 may surround the display area DA in a plan view. The sealing member 500 may overlap the non-display area NDA in a plan view. Thus, the inside space between the light-emitting element layer 300 and the sealing substrate 400 may be sealed, and a moisture absorbent and/or a filler may be arranged in the inside space.

In an embodiment, the sealing member 500 may be a sealant. In an alternative embodiment, the sealing member 500 may include a material cured by laser. In an embodiment, for example, the sealing member 500 may be frit. In such an embodiment, the sealing member 500 may include an organic sealant, such as a urethane-based resin, an epoxy-based resin or an acryl-based resin, or an inorganic sealant. In an embodiment, the sealing member 500 may include silicone. Urethane acrylate or the like, for example, may be used for the urethane-based resin. Buthylacrylate, ethylhexacrylate, or the like, for example, may be used for the acryl-based resin. The sealing member 500 may include a material cured by heat.

Referring to FIG. 2B, in an alternative embodiment, the sealing structure may include an encapsulation layer 600. The encapsulation layer 600 may include at least one inorganic encapsulation layer and at least one organic encapsulation layer. At least one inorganic encapsulation layer and at least one organic encapsulation layer may be alternately stacked one on another. In an embodiment, the encapsulation layer 600 may include a first inorganic encapsulation layer 610, an organic encapsulation layer 620, and a second inorganic encapsulation layer 630, which are sequentially stacked one on another. The first inorganic encapsulation layer 610 and the second inorganic encapsulation layer 630 may be in contact with each other in the non-display area NDA. The inorganic encapsulation layer may include at least one inorganic materials selected from aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). In an embodiment, zinc oxide ($ZnO_x$) may be zinc oxide (ZnO) and/or peroxide ($ZnO_2$). The organic encapsulation layer may include a polymer-based material. The polymer-based material may include an acryl-based resin, an epoxy-based resin, polyimide, or polyethylene. In an embodiment, the organic encapsulation layer may include acrylate.

In an alternative embodiment, the sealing structure may include the sealing substrate 400 and the sealing member 500 of FIG. 2A and the encapsulation layer 600 of FIG. 2B.

In an embodiment, a touch sensor layer (not shown) may be arranged on the sealing structure. The touch sensor layer may obtain coordinate information according to an external input, for example, a touch event.

In an embodiment, an antireflection layer (not shown) may be arranged on the touch sensor layer. The antireflection layer may reduce the reflectivity of light incident onto the display device 1. In an embodiment, the antireflection layer may include a retarder and/or a polarizer. The retarder may be of a film type or liquid crystal coating type and may include a $\lambda/2$ retarder and/or a $\lambda/4$ retarder. The polarizer may also be of a film type or liquid crystal coating type. The film type polarizer may include a stretched synthetic resin film, and the liquid crystal coating type polarizer may include liquid crystals arranged in a certain array. The retarder and the polarizer may further include a protective film.

In an alternative embodiment, the antireflection layer may include a black matrix and color filters. The color filters may be arranged considering the color of light emitted from the light-emitting element of the display device 1. Each of the color filters may include a red, green, or blue pigment or dye. Alternatively, each of the color filters may further include quantum dots except for the above-described pigment or dye. Alternatively, some of the color filters may not include the above-described pigment or dye and may include scattering particles such as titanium oxide.

In another alternative embodiment, the antireflection layer may include an offset interference structure. The offset interference structure may include a first reflection layer and a second reflection layer arranged on different layers. First reflected light and second reflected light which are reflected from the first reflection layer and the second reflection layer, respectively, may offset interfere with each other, and thus, the reflectivity of external light may be reduced.

Figure 3:
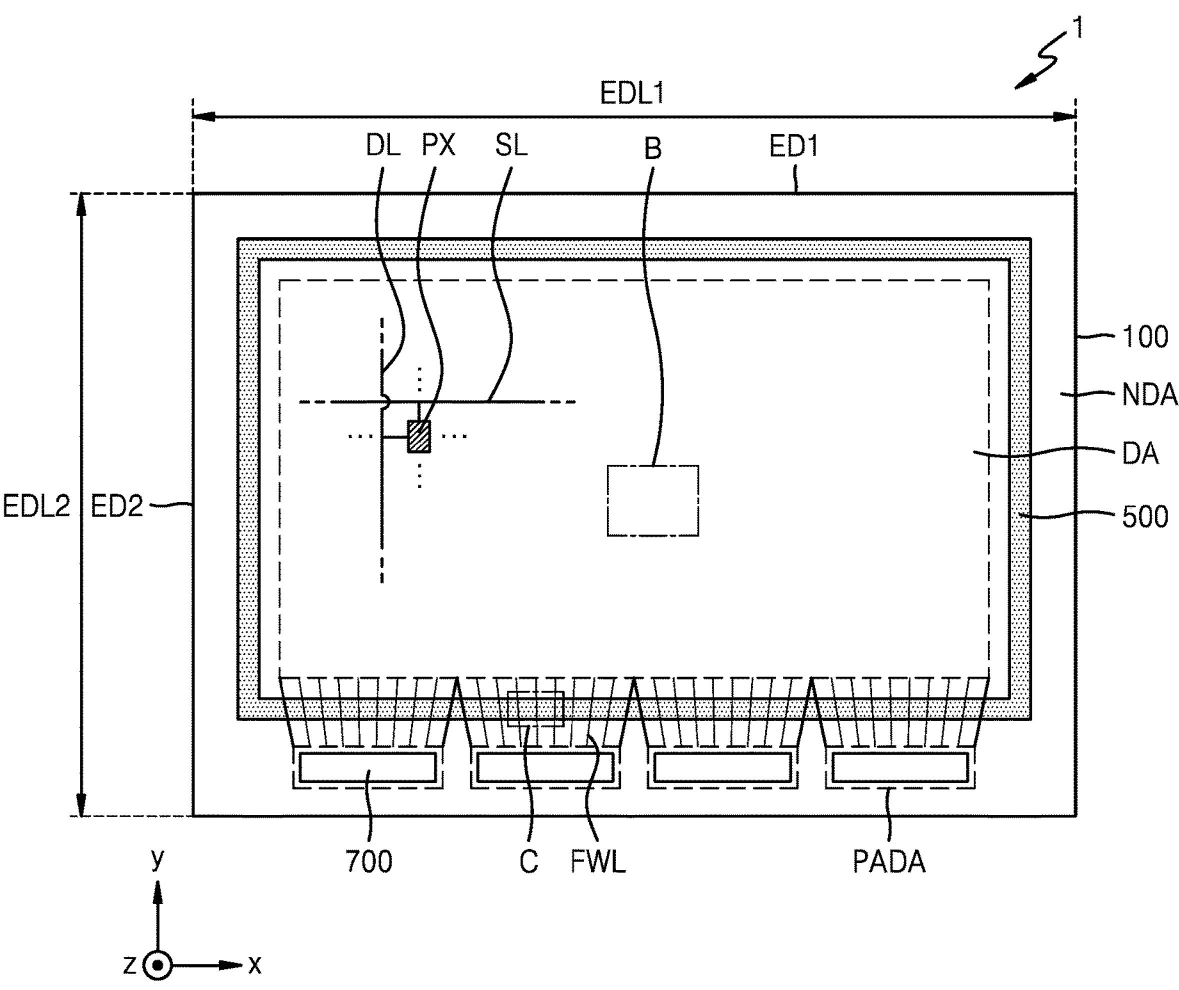
FIG. 3 is a plan view schematically illustrating a display device according to an embodiment.

FIG. 3 is a plane view schematically illustrating the display device 1 according to an embodiment.

Referring to FIG. 3, an embodiment of the display device 1 may include a substrate 100, pixels PX, a gate wiring, a data line DL, a fanout wiring FWL, a sealing member 500, and a driving unit 700. The substrate 100 may have a first edge ED1 and a second edge ED2. The first edge ED1 may extend in a first direction (e.g., an x-direction). The second edge ED2 may extend in a second direction (e.g., a y-direction). In an embodiment, a length EDL1 of the first edge ED1 may be greater than a length EDL2 of the second edge ED2. The number of the pixels PX arranged in the first direction (e.g., an x-direction) may be greater than the number of the pixels PX arranged in the second direction (e.g., a y-direction).

The substrate 100 may include a display area DA and a non-display area NDA. The display area DA may be an area in which the display device 1 displays an image. The non-display area NDA may be adjacent to the display area DA. In an embodiment, the non-display area NDA may surround the display area DA. The non-display area NDA may be an area in which the display device 1 does not display an image. The non-display area NDA may include a pad area PADA. The pad area PADA may be outside the display area DA. In an embodiment, the pad area PADA may be provided in plural. In such an embodiment, the pad area PADA may include a plurality of pad areas PADA. In an embodiment, the plurality of pad areas PADA may be arranged in parallel in the first direction (e.g., an x-direction). In FIG. 3, a plurality of pad areas PADA are shown. However, in an alternative embodiment, the display device 1 may include a single pad area PADA. In FIG. 3, the pad areas PADA are outside in a −y-direction from the display area DA. However, in an alternative embodiment, the pad areas PADA may be outside in a y-direction, a −x-direction or an x-direction from the display area DA.

Pixels PX may be arranged in the display area DA. A plurality of pixels PX may be arranged in the display area DA. The pixels PX may be electrically connected to the gate wiring and the data line DL. The gate wiring may extend in the first direction (e.g., an x-direction). The gate wiring may overlap the display area DA in a plan view. The gate wiring may be a scan line SL, for example. The data line DL may extend in the second direction (e.g., a y-direction). In a plan view, the data line DL may overlap the display area DA.

The fanout wiring FWL may extend in a direction toward the display area DA from the pad area PADA. The fanout wiring FWL may overlap the non-display area NDA in a plan view. In an embodiment, the fanout wiring FWL may be a signal line. The fanout wiring FWL may be electrically connected to the data line DL. In an alternative embodiment, the fanout wiring FWL may be a power supply line. In an embodiment, the fanout wiring FWL may extend in the display area DA from the plurality of pad areas PADA.

The sealing member 500 may be arranged in the non-display area NDA. The sealing member 500 may surround the display area DA in a plan view. In an embodiment, the fanout wiring FWL may extend to cross or overlap the sealing member 500 in a plan view.

The driving unit 700 may be arranged in the pad area PADA. Although not shown, a pad may be arranged in the pad area PADA, and the driving unit 700 may be electrically connected to the pad. The driving unit 700 may generate and output signals and voltages for driving the display device 1. The signals and/or voltages generated by the driving unit 700 may be transferred to the pixels PX arranged in the display area DA through the fanout wiring FWL. The driving unit 700 may include an integrated circuit (IC). The driving unit 700 may be electrically connected to the pad by using an anisotropic conductive film. In some embodiments, the driving unit 700 may include a printed circuit board. The printed circuit board may be a flexible printed circuit board or a rigid printed circuit board. Alternatively, the driving unit 700 may include a complex printed circuit board including both the rigid printed circuit board and the flexible printed circuit board in some cases. In such an embodiment, an IC may be arranged on the printed circuit board.

In an embodiment, a material of the gate wiring and a material of the fanout wiring FWL may be different from each other. The gate wiring may include a material for providing a relatively low sheet resistance. In an embodiment, for example, the gate wiring may include aluminum (Al). Thus, a sheet resistance (unit: Ω/sq) of the gate wiring may be lower than a sheet resistance of the fanout wiring FWL. The sheet resistance of the gate wiring may be lower by twice or more than the sheet resistance of the fanout wiring FWL, that is, may be less than or equal to about a half (i.e., about 50%) of the sheet resistance of the fanout wiring FWL. In an embodiment, for example, the value of the sheet resistance of the gate wiring may be about 30% of the value of the sheet resistance of the fanout wiring FWL. In an embodiment, the gate wiring may extend in the first direction (e.g., an x-direction). Because a length EDL1 of the first edge ED1 is greater than a length EDL2 of the second edge ED2, the sheet resistance of the gate wiring extending in the first direction (e.g., an x-direction) is desired to be small. In an embodiment, because the gate wiring includes a material for providing a low sheet resistance, the sheet resistance of the gate wiring may be low. Thus, the response speed of the display device 1 may be increased, and the display quality of the display device 1 may be increased.

In an embodiment, the fanout wiring FWL may include a material having a higher melting point than a melting point of the gate wiring. In such an embodiment, the melting point of a material included in the fanout wiring FWL may be higher than the melting point of a material included in the gate wiring. In an embodiment, for example, the fanout wiring FWL may include molybdenum (Mo). The fanout wiring FWL may extend while crossing the sealing member 500 in a plan view. Laser may be used in a process of combining the encapsulation substrate with the sealing member 500. If the fanout wiring FWL includes aluminum (Al), the melting point of Al is relatively low. Thus, the fanout wiring FWL may be melted by laser. In this case, the fanout wiring FWL including AL may be damaged, or the sheet resistance of the fanout wiring FWL may be increased. In an embodiment, the fanout wiring FWL may include molybdenum (Mo), for example. Thus, even when laser is used in a process of combining the sealing substrate with the sealing member 500, damaging of the fanout wiring FWL may be effectively prevented or substantially reduced.

Figure 4:
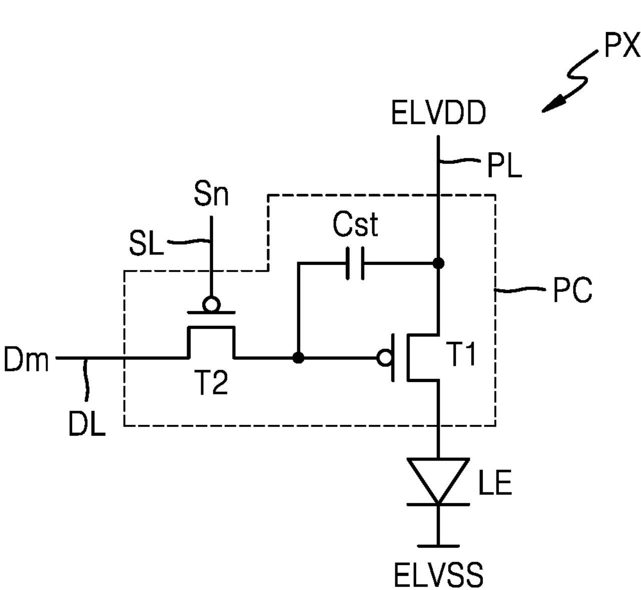
FIG. 4 is an equivalent circuit diagram schematically one pixel of a display device according to an embodiment.

FIG. 4 is an equivalent circuit diagram schematically one pixel PX of a display device according to an embodiment.

Referring to FIG. 4, an embodiment of a pixel PX may include a pixel circuit PC and a light-emitting element LE electrically connected to the pixel circuit PC. The pixel circuit PC may include a first transistor T1, a second transistor T2, and a storage capacitor Cst. The pixel PX may emit light of a red color, a green color, or a blue color, for example, through the light-emitting element LE or may emit light of a red color, a green color, or a white color.

The second transistor T2 may be a switching transistor. The second transistor T2 may be connected to the scan line SL and the data line DL and may transmit a data voltage or data signal Dm inputted from the data line DL in response to a scan voltage or scan signal Sn inputted from the scan line SL.

The storage capacitor Cst may be connected to a driving voltage line PL of the second transistor T2 and may store a voltage corresponding to a difference between a voltage transmitted from the second transistor T2 and a first power supply voltage ELVDD supplied to the driving voltage line PL.

The first transistor T1 may be a driving transistor. The first transistor T1 may be connected to the driving voltage line PL and the storage capacitor Cst and may control a driving current flowing through the light-emitting element LE from the driving voltage line PL in response to a voltage value stored in the storage capacitor Cst. The light-emitting element LE may emit light having a brightness corresponding to the driving current. An opposite electrode (e.g., a cathode) of the light-emitting element LE may receive a second power supply voltage ELVSS.

FIG. 4 illustrates an embodiment where the pixel circuit PC includes two transistors and one storage capacitor. However, in an alternative embodiment, the pixel circuit PC may include three or more transistors.

Figure 5:
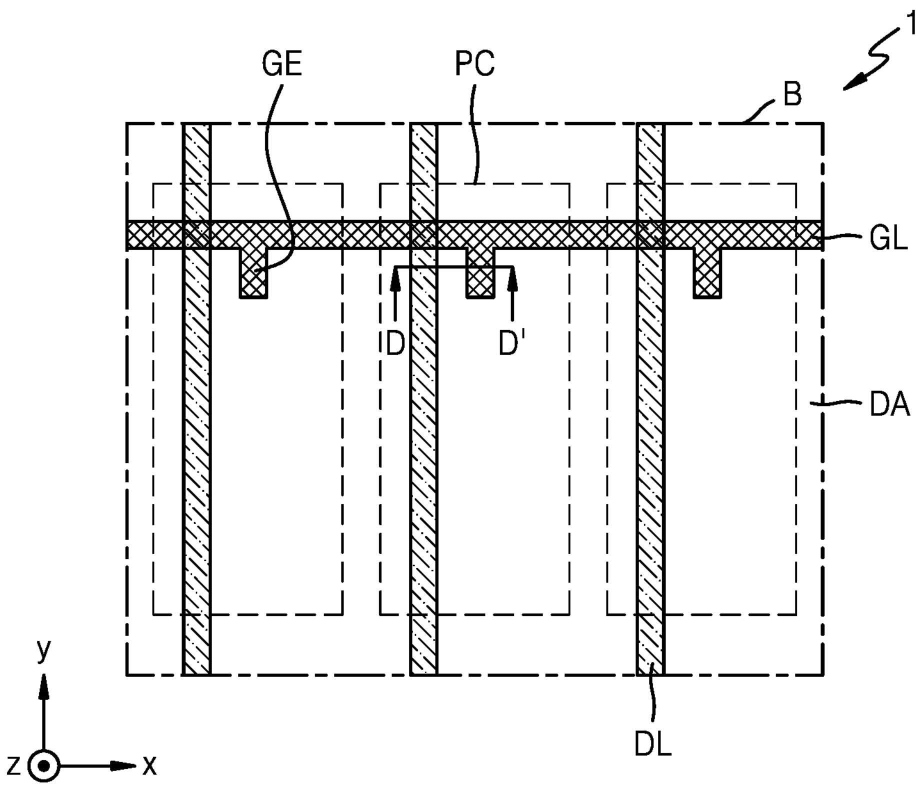
FIG. 5 is an enlarged view of a region B of the display device of FIG. 3.

FIG. 5 is an enlarged view of a region B of the display device 1 of FIG. 3.

Referring to FIGS. 3 and 5, an embodiment of the display device 1 may include a substrate 100, a pixel circuit PC, a gate wiring GL, and a data line DL. The substrate 100 may include a display area DA. The pixel circuit PC may be arranged in the display area DA. In such an embodiment, the pixel circuit PC may overlap the display area DA in a plan view. In an embodiment, where a plurality of pixels PX is arranged on the substrate, the pixel circuit PC may be provided in plural. In such an embodiment, the plurality of pixel circuits PC may be arranged in a first direction (e.g., an x-direction) and/or a second direction (e.g., a y-direction).

The gate wiring GL may overlap the display area DA in a plan view. The gate wiring GL may extend in the first direction (e.g., an x-direction). The gate wiring GL may overlap the plurality of pixel circuits PC arranged in the first direction (e.g., an x-direction) in a plan view. Although not shown in FIG. 5, the gate wiring GL may include a plurality of gate wirings GL. The plurality of gate wirings GL may be spaced apart from each other in the second direction (e.g., a y-direction).

The pixel circuit PC may include a gate electrode GE. The gate wiring GL and the gate electrode GE may be integrally formed with each other as a single unitary and indivisible part. In an embodiment, a portion of the gate wiring GL protruding in the second direction (e.g., a y-direction) may define the gate electrode GE. In an embodiment, a portion of the gate wiring GL protruding in a −y-direction may define the gate electrode GE as shown in FIG. 5. In an alternative embodiment, a portion of the gate wiring GL extending in the first direction (e.g., an x-direction) may define a gate electrode GE. In a case where the gate wiring GL and the gate electrode GE are not integrally formed with each other as a single unitary and indivisible part, the gate wiring GL and the gate electrode GE may be electrically connected to each other via a contact hole of an insulating layer. In this case, the area of the pixel circuit PC may be increased. In an embodiment, the gate wiring GL and the gate electrode GE are integrally formed with each other as a single unitary and indivisible part so that the area of the substrate 100 may be effectively utilized.

The data line DL may overlap the display area DA in a plan view. The data line DL may extend in the second direction (e.g., a y-direction). The data line DL may cross the gate wiring GL in a plan view. Although not shown in FIG. 5, the data line DL may overlap the plurality of pixel circuits PC arranged in the second direction (e.g., a y-direction) in a plan view. The data line DL may be provided in plural, and the plurality of data lines DL may be spaced apart from each other in the first direction (e.g., an x-direction). The plurality of data lines DL may overlap the plurality of pixel circuits PC arranged in the first direction (e.g., an x-direction), respectively, in a plan view.

Figure 6:
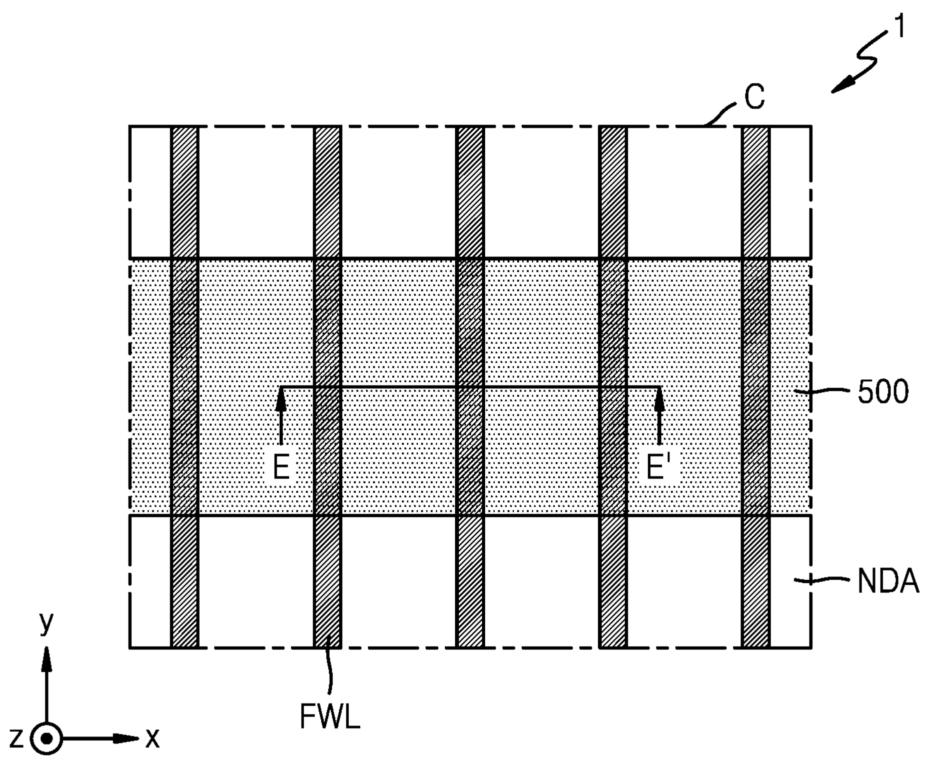
FIG. 6 is an enlarged view of a region C of the display device of FIG. 3.

FIG. 6 is an enlarged view of a region C of the display device 1 of FIG. 3.

Referring to FIGS. 3 and 6, an embodiment of the display device 1 may include a substrate 100, a fanout wiring FWL, and a sealing member 500. The substrate 100 may include a non-display area NDA. The fanout wiring FWL may be arranged in the non-display area NDA. The fanout wiring FWL may extend in a direction toward the display area from a pad area in a plan view. In an embodiment, the fanout wiring FWL may extend in the second direction (e.g., a y-direction). In an alternative embodiment, the fanout wiring FWL may extend in a direction crossing the first direction (e.g., an x-direction) and the second direction (e.g., a y-direction). The fanout wiring FWL may include a material having a higher melting point than a melting point of the gate wiring. The fanout wiring FWL may be provided in plural.

The sealing member 500 may be arranged in the non-display area NDA. In an embodiment, the fanout wiring FWL may extend while crossing the sealing member 500 in a plan view. In an embodiment, the fanout wiring FWL may include Mo, for example. Thus, even when laser is used in a process of combining the sealing substrate with the sealing member 500, damaging of the fanout wiring FWL may be prevented or reduced.

Figure 7:
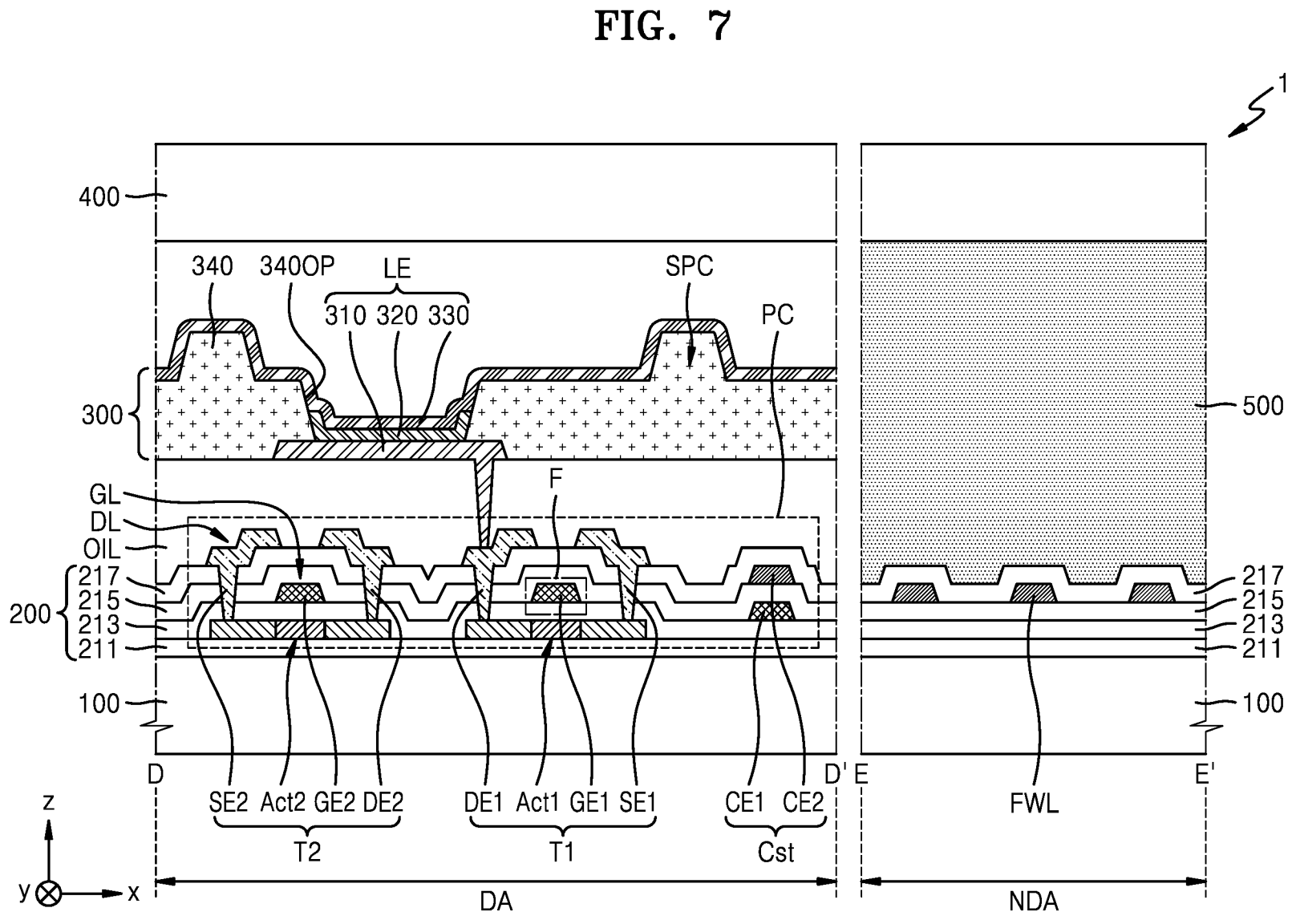

FIG. 7 is a cross-sectional view schematically illustrating a display device 1 taken along line D-D' of FIG. 5 and line E-E' of FIG. 6, according to an embodiment.

Referring to FIG. 7, an embodiment of the display device 1 may include a substrate 100, an inorganic insulating layer 200, a pixel circuit PC, a gate wiring GL, a data line DL, an organic insulating layer OIL, a light-emitting element layer 300, a sealing substrate 400, a fanout wiring FWL, and a sealing member 500. The display device 1 or the substrate 100 may include a display area DA and a non-display area NDA.

The inorganic insulating layer 200 may be arranged on the substrate 100. The inorganic insulating layer 200 may overlap the display area DA and the non-display area NDA. The inorganic insulating layer 200 may include a buffer layer 211, a first inorganic insulating layer 213, a second inorganic insulating layer 215, and a third inorganic insulating layer 217. The buffer layer 211, the first inorganic insulating layer 213, the second inorganic insulating layer 215, and the third inorganic insulating layer 217 may be sequentially stacked one on another on the substrate 100.

The pixel circuit PC may include at least one transistor and at least one storage capacitor Cst. In an embodiment, the pixel circuit PC may include a first transistor T1, a second transistor T2, and a storage capacitor Cst. The first transistor T1 may include a first semiconductor layer Act1, a first gate electrode GE1, a first source electrode SE1, and a first drain electrode DE1. The second transistor T2 may include a second semiconductor layer Act2, a second gate electrode GE2, a second source electrode SE2, and a second drain electrode DE2. The storage capacitor Cst may include a first capacitor electrode CE1 and a second capacitor electrode CE2.

The buffer layer 211 may be arranged on the substrate 100. The buffer layer 211 may overlap the display area DA and the non-display area NDA in a plan view. The buffer layer 211 may include an inorganic insulating material such as silicon nitride ($SiN_x$), silicon oxynitride (SiON), or silicon oxide ($SiO_2$), and may have a single layer or multi-layered structure including the above-described inorganic insulating material.

The first semiconductor layer Act1 and the second semiconductor layer Act2 may be arranged on the buffer layer 211. In an embodiment, the first semiconductor layer Act1 and the second semiconductor layer Act2 may be arranged between the substrate 100 and the first inorganic insulating layer 213. The first semiconductor layer Act1 and the second semiconductor layer Act2 may overlap the display area DA in a plan view. At least one selected from the first semiconductor layer Act1 and the second semiconductor layer Act2 may include polysilicon. Alternatively, at least one selected from the first semiconductor layer Act1 and the second semiconductor layer Act2 may include amorphous silicon, a silicon semiconductor, or an organic semiconductor. In an embodiment, each of the first semiconductor layer Act1 and the second semiconductor layer Act2 may include a channel region and a source region and a drain region arranged at each of opposing sides of the channel region.

The first inorganic insulating layer 213 may be arranged on the buffer layer 211, the first semiconductor layer Act1, and the second semiconductor layer Act2. In an embodiment, the first inorganic insulating layer 213 may be a first gate insulating layer. The first inorganic insulating layer 213 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The first gate electrode GE1 and the second gate electrode GE2 may be arranged on the first inorganic insulating layer 213. In an embodiment, the first gate electrode GE1 and the second gate electrode GE2 may be arranged between the first inorganic insulating layer 213 and the second inorganic insulating layer 215. The first gate electrode GE1 may overlap the first semiconductor layer Act1. In an embodiment, the first gate electrode GE1 may overlap the channel region of the first semiconductor layer Act1. The second gate electrode GE2 may overlap the second semiconductor layer Act2. In an embodiment, the second gate electrode GE2 may overlap the channel region of the second semiconductor layer Act1.

The gate electrode GL may be inserted into or disposed inside the inorganic insulating layer 200. In such an embodiment, the gate wiring GL may be arranged between the first inorganic insulating layer 213 and the second inorganic insulating layer 215. In an embodiment, the gate wiring GL and the gate electrode may be integrally formed with each other as a single unitary and indivisible part. In an embodiment, for example, the gate wiring GL may be integrally form with the first gate electrode GE1 and/or the second gate electrode GE2 as a single unitary and indivisible part.

The first capacitor electrode CE1 may be arranged on the first inorganic insulating layer 213. The first capacitor electrode CE1 may be arranged between the first inorganic insulating layer 213 and the second inorganic insulating layer 215. In an embodiment, the first capacitor electrode CE1 may be spaced apart from the first gate electrode GE1. In an alternative embodiment, the first capacitor electrode CE1 may be integrally form with the first gate electrode GE1 as a single unitary and indivisible part.

The gate wiring GL, the first gate electrode GE1, the second gate electrode GE2, and the first capacitor electrode CE1 may be arranged in (or directly on) a same layer as each other and may include a same material as each other. The gate wiring GL, the first gate electrode GE1, the second gate electrode GE2, and the first capacitor electrode CE1 may include a material for providing a relatively low sheet resistance, for example, Al.

The second inorganic insulating layer 215 may be arranged on the gate wiring GL, the first gate electrode GE1, the second gate electrode GE2, the first capacitor electrode CE1, and the first inorganic insulating layer 213. In an embodiment, the second inorganic insulating layer 215 may be a second gate insulating layer. The second inorganic insulating layer 215 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The second capacitor electrode CE2 may be arranged on the second inorganic insulating layer 215. The second capacitor electrode CE2 may overlap the first capacitor electrode CE1 in a plan view. The first capacitor electrode CE1 and the second capacitor electrode CE2 may constitute or collectively define the storage capacitor Cst. The second capacitor electrode CE2 may include a conductive material, such as Mo.

The third inorganic insulating layer 217 may be arranged on the second capacitor electrode CE2 and the second inorganic insulating layer 215. In an embodiment, the third inorganic insulating layer 217 may be an interlayer insulating layer. The third inorganic insulating layer 217 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The first source electrode SE1, the first drain electrode DE1, the second source electrode SE2, the second drain electrode DE2, and the data line DL may be arranged on the third inorganic insulating layer 217. In an embodiment, each of the first source electrode SE1 and the first drain electrode DE1 may be electrically connected to the first semiconductor layer Act1 through contact holes provided or defined in the first inorganic insulating layer 213, the second inorganic insulating layer 215, and the third inorganic insulating layer 217. Each of the second source electrode SE1 and the second drain electrode DE2 may be electrically connected to the second semiconductor layer Act2 through contact holes provided or defined in the first inorganic insulating layer 213, the second inorganic insulating layer 215, and the third inorganic insulating layer 217. In an embodiment, the data line DL may be integrally formed with the first source electrode SE1 or the second source electrode SE2 as a single unitary and indivisible part.

In an embodiment, the first source electrode SE1, the first drain electrode DE1, the second source electrode SE2, the second drain electrode DE2, and the data line DL may be arranged in a same layer as each other and may include a same material as each other. At least one selected from the first source electrode SE1, the first drain electrode DE1, the second source electrode SE2, the second drain electrode DE2, and the data line DL may include a conductive material including Mo, Al, Cu, or Ti, and may have a single layer or multi-layered structure including the above-described materials. In an embodiment, at least one selected from the first source electrode SE1, the first drain electrode DE1, the second source electrode SE2, the second drain electrode DE2, and the data line DL may have a multi-layered structure of Ti/Al/Ti.

The organic insulating layer OIL may be arranged on the inorganic insulating layer 200, the first source electrode SE1, the first drain electrode DE1, the second source electrode SE2, and the second drain electrode DE2. The organic insulating layer OIL may include an organic material. The organic insulating layer OIL may include an organic insulating material such as a general-purpose polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The light-emitting element layer 300 may be arranged on the organic insulating layer OIL. In an embodiment, the light-emitting element layer 300 may be arranged on the inorganic insulating layer 200. The light-emitting element layer 300 may include a light-emitting element LE and a pixel defining layer 340. In an embodiment, the light-emitting element LE may be an organic light-emitting diode. The light-emitting element LE may include a pixel electrode 310, a light-emitting layer 320, and an opposite electrode 330.

The pixel electrode 310 may be arranged on the organic insulating layer OIL. The pixel electrode 310 may be electrically connected to the pixel circuit PC. In an embodiment, a contact hole may be defined in the organic insulating layer OIL. The pixel electrode 310 may be electrically connected to the pixel circuit PC through the contact hole of the organic insulating layer OIL. In an embodiment, the pixel electrode 310 may be electrically connected to the first source electrode SE1 or the first drain electrode DE1. In an embodiment, the pixel electrode 310 may be directly connected to the first source electrode SE1 or the first drain electrode DE1 through the contact hole of the organic insulating layer OIL. The pixel electrode 310 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In an alternative embodiment, the pixel electrode 310 may include a reflective layer including silver (Ag), magnesium (Mg), Al, platinum (Pt), palladium (Pd), gold (Au), nickel (Ni), Nd, Ir, Cr, or a compound thereof. In an alternative embodiment, the pixel electrode 310 may further include a layer formed of ITO, IZO, ZnO, or $In_2O_3$ on/under the above-described reflective layer.

The pixel defining layer 340, through which an opening 3400P is defined to expose the central portion of the pixel electrode 310, may be arranged on the pixel electrode 310. The pixel defining layer 340 may include an organic insulating material and/or an inorganic insulating material. In some embodiments, the pixel defining layer 340 may include a light-blocking material. The opening 3400P of the pixel defining layer 340 may define a light-emitting region of light emitted from the light-emitting element LE.

In an embodiment, the pixel defining layer 340 may include a spacer SPC protruding in the thickness direction of the substrate 100. The spacer SPC may protrude in a third direction (e.g., a z-direction) from the pixel defining layer 340. The pixel defining layer 340 including the spacer SPC may be formed using a halftone mask. In some embodiments, the spacer SPC may include a different material from the pixel defining layer 340 and may be arranged on the pixel defining layer 340.

The light-emitting layer 320 may be arranged in the opening 3400P of the pixel defining layer 340. The light-emitting layer 320 may include a polymer or small molecular weight organic material that emits light of a certain color. Although not shown, a first functional layer and a second functional layer may be arranged under/on the light-emitting layer 320. The first functional layer may include, for example, a hole transport layer (HTL), or a hole transport layer and a hole injection layer (HIL). The second functional layer that is a component arranged on the light-emitting layer 320 may be optional. The second functional layer may include an electron transport layer (ETL) and/or an electron injection layer (EIL). The first functional layer and/or the second functional layer may be a common layer formed to entirely cover the substrate 100, like in the opposite electrode 330 to be described later.

The opposite electrode 330 may be arranged on the light-emitting layer 320. The opposite electrode 330 may include a conductive material having a small work function. In an embodiment, for example, the opposite electrode 330 may include a (semi-)transparent layer including Ag, Mg, Al, Pt, Pd, Au, Ni, Nd, Ir, Cr, lithium (Li), calcium (Ca), or an alloy thereof. Alternatively, the opposite electrode 330 may further include a layer such as ITO, IZO, ZnO, or $In_2O_3$ on the (semi-)transparent layer including the above-described materials.

The non-display area NDA may be an area in which the display device 1 does not display an image. The organic insulating layer 200 may overlap the non-display area NDA in a plan view.

The fanout wiring FWL may be arranged in the non-display area NDA. The fanout wiring FWL may extend in a direction toward the display area DA from a pad area in a plan view. The fanout wiring FWL may be inserted into or disposed inside the inorganic insulating layer 200. The fanout wiring FWL may be arranged between the second inorganic insulating layer 215 and the third inorganic insulating layer 217. In an embodiment, the fanout wiring FWL may be arranged in a same layer as the second capacitor electrode CE2 and may include a same material as the second capacitor electrode CE2. The fanout wiring FWL may be provided in plural.

The plurality of fanout wirings FWL may be arranged in a same layer as each other. In an embodiment, for example, the fanout wirings FWL may include adjacent fanout wirings FWL. The adjacent fanout wirings FWL may be arranged between the second inorganic insulating layer 215 and the third inorganic insulating layer 217. The adjacent fanout wirings FWL may include a same material as each other.

The fanout wiring FWL may include a material having a higher melting point than a melting point of the gate wiring GL. The fanout wiring FWL may include Mo, for example. In such an embodiment, even when laser is used in a process of combining the sealing substrate 400 with the sealing member 500, damaging of the fanout wiring FWL may be effectively prevented or substantially reduced.

The sealing substrate 400 may be arranged on the light-emitting element layer 300. In an embodiment, the light-emitting element layer 300 may be arranged between the substrate 100 and the sealing substrate 400. The sealing substrate 400 may be a transparent member.

The sealing member 500 may be arranged between the substrate 100 and the sealing substrate 400. In an embodiment, the sealing member 500 may be arranged between the inorganic insulating layer 200 and the sealing substrate 400. The sealing member 500 may overlap the non-display area NDA in a plan view. Thus, the inside space between the light-emitting element layer 300 and the sealing substrate 400 may be sealed, and a moisture absorbent and/or a filler may be arranged in the inside space.

A material of the gate wiring GL and a material of the fanout wiring FWL may be different from each other. The gate wiring GL may include a material for providing a relatively low sheet resistance. In an embodiment, for example, the gate wiring GL may include Al. Thus, the gate wiring GL may be maintained at a low resistance, and the response speed of the display device 1 may be increased, and the display quality of the display device 1 may be increased.

The gate wiring GL and the fanout wiring FWL may be arranged in different layers from each other. In an embodiment, for example, the gate wiring GL may be arranged between the first inorganic insulating layer 213 and the second inorganic insulating layer 215, and the fanout wiring FWL may be arranged between the second inorganic insulating layer 215 and the third inorganic insulating layer 217. The gate wiring GL may include a material for providing a relatively low sheet resistance and may be maintained at a low resistance. The fanout wiring FWL may include a material having a high melting point. Even when laser is used in a process of combining the sealing substrate 400 with the sealing member 500, damaging of the fanout wiring FWL may be effectively prevented or substantially reduced.

Figure 8A:
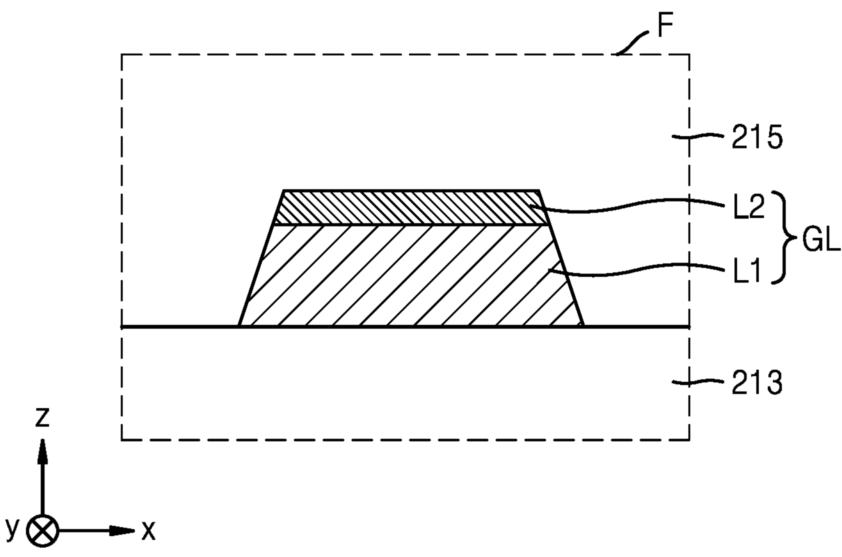
FIGS. 8A and 8B are enlarged cross-sectional views of a region F of FIG. 7 according to an embodiment.
Figure 8B:
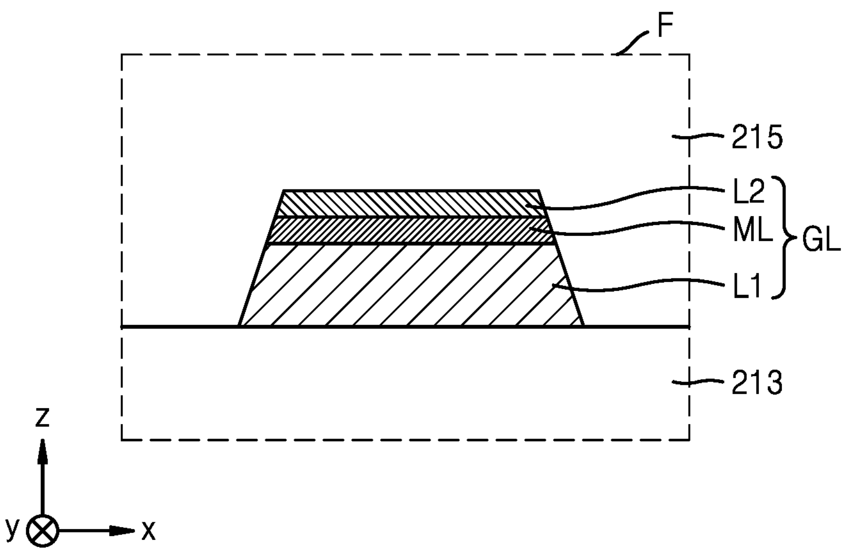

FIGS. 8A and 8B are enlarged cross-sectional views of a region F of FIG. 7 according to an embodiment.

Referring to FIGS. 8A and 8B, the gate wiring GL may be arranged between the first inorganic insulating layer 213 and the second inorganic insulating layer 215. The gate wiring GL may include at least one selected from Ti and titanium nitride (TiN) and Al.

Referring to FIG. 8A, in an embodiment, the gate wiring GL may include a first layer L1 and a second layer L2. The first layer L1 may include Al. The second layer L2 may be arranged on the first layer L1. The second layer L2 may include Ti. The second layer L2 may be configured to prevent or reduce hillock defects of the first layer L1 including Al.

Referring to FIG. 8B, in an alternative embodiment, the gate wiring GL may include a first layer L1, a second layer L2, and a middle layer ML. The first layer L1 may include Al. The second layer L2 may be arranged on the first layer L1. The second layer L2 may include Ti. The middle layer ML may be arranged between the first layer L1 and the second layer L2. The middle layer ML may include TiN. In such an embodiment, the resistance of the gate wiring GL may be maintained to be low.

Figure 9:
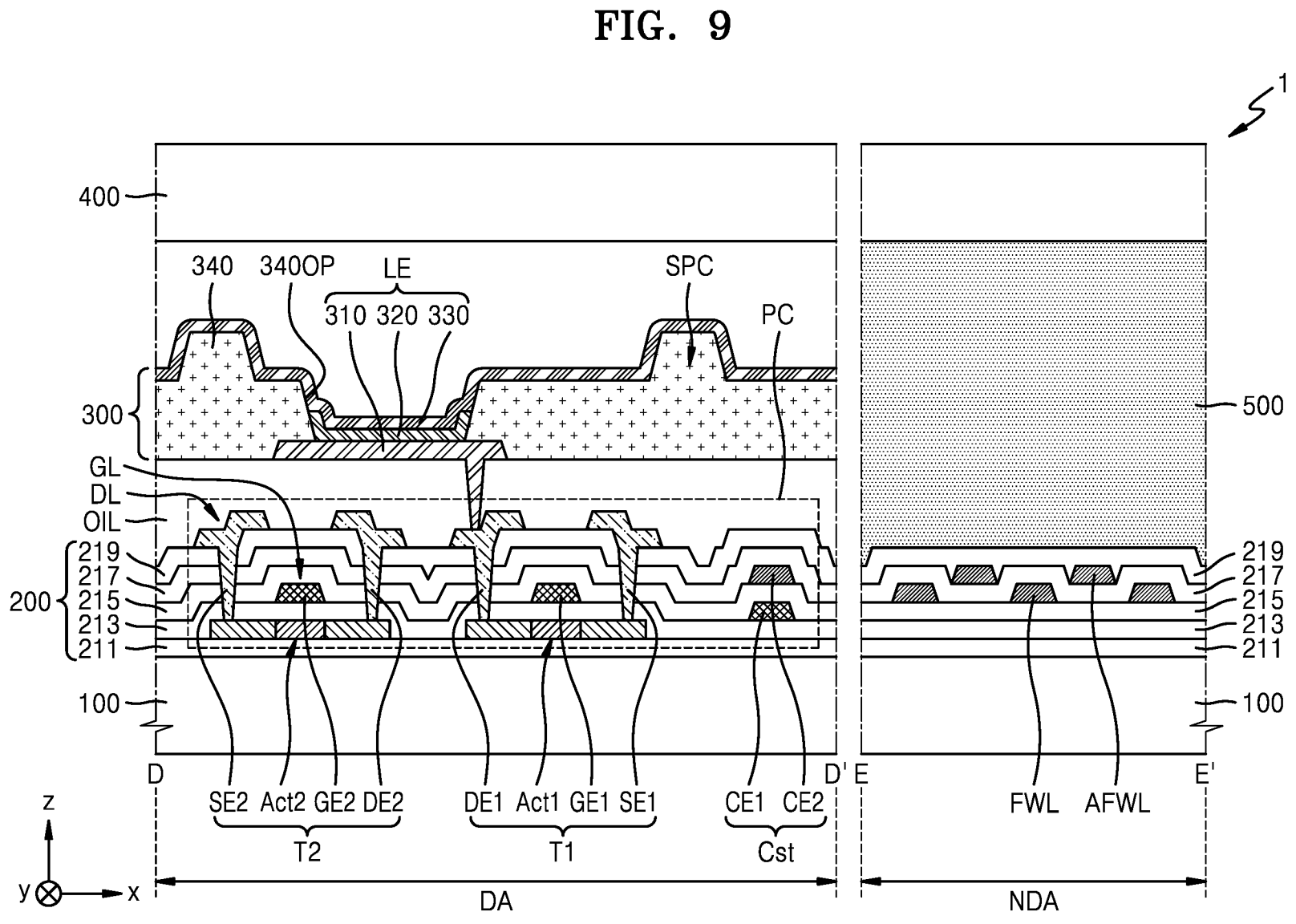

FIG. 9 is a cross-sectional view schematically illustrating the display device 1 taken along line D-D' of FIG. 5 and line E-E' of FIG. 6, according to an alternative embodiment. The same or like elements in FIG. 9 as those in FIG. 7 have been labeled with the same reference characters, and any repetitive detailed description thereof will hereinafter be omitted or simplified.

Referring to FIG. 9, an embodiment of the display device 1 may include a substrate 100, an inorganic insulating layer 200, a pixel circuit PC, a gate wiring GL, a data line DL, an organic insulating layer OIL, a light-emitting element layer 300, a sealing substrate 400, a fanout wiring FWL, an additional fanout wiring AFWL, and a sealing member 500. The substrate 100 may include a display area DA and a non-display area NDA.

The inorganic insulating layer 200 may be arranged on the substrate 100. The inorganic insulating layer 200 may overlap the display area DA and the non-display area NDA. The inorganic insulating layer 200 may include a buffer layer 211, a first inorganic insulating layer 213, a second inorganic insulating layer 215, a third inorganic insulating layer 217, and a fourth inorganic insulating layer 219. The buffer layer 211, the first inorganic insulating layer 213, the second inorganic insulating layer 215, the third inorganic insulating layer 217, and the fourth inorganic insulating layer 219 may be sequentially stacked one on another on the substrate 100. The embodiment shown in FIG. 9 is substantially the same as the embodiment described above with reference to FIG. 7 except for further including the fourth inorganic insulating layer 219 and the additional fanout wiring AFWL.

In an embodiment, as shown in FIG. 9, the fourth inorganic insulating layer 219 may be arranged on the third inorganic insulating layer 217. The fourth inorganic insulating layer 219 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The pixel circuit PC may include at least one transistor and at least one storage capacitor Cst. In an embodiment, the pixel circuit PC may include a first transistor T1, a second transistor T2, and a storage capacitor Cst. The first transistor T1 may include a first semiconductor layer Act1, a first gate electrode GE1, a first source electrode SE1, and a first drain electrode DE1. The second transistor T2 may include a second semiconductor layer Act2, a second gate electrode GE2, a second source electrode SE2, and a second drain electrode DE2. The storage capacitor Cst may include a first capacitor electrode CE1 and a second capacitor electrode CE2. The first source electrode SE1, the first drain electrode DE1, the second source electrode SE2, the second drain electrode DE2, and the data line DL may be arranged on the fourth inorganic insulating layer 219.

The additional fanout wiring AFWL may be arranged in the non-display area NDA. The additional fanout wiring AFWL may be arranged between the third inorganic insulating layer 217 and the fourth inorganic insulating layer 219. The additional fanout wiring AFWL may extend in a direction toward the display area DA from a pad area in a plan view. The additional fanout wiring AFWL may be arranged alternating with the fanout wiring FWL in a plan view. In an embodiment, for example, the additional fanout wiring AFWL may be arranged between the adjacent fanout wirings FWL in a plan view. The additional fanout wiring AFWL may include a material having a higher melting point than a melting point of the gate wiring GL. The additional fanout wiring AFWL may include Mo, for example. In such an embodiment, even when laser is used in a process of combining the sealing substrate 400 with the sealing member 500, damaging of the additional fanout wiring AFWL may be effectively prevented or substantially reduced.

Figure 10:
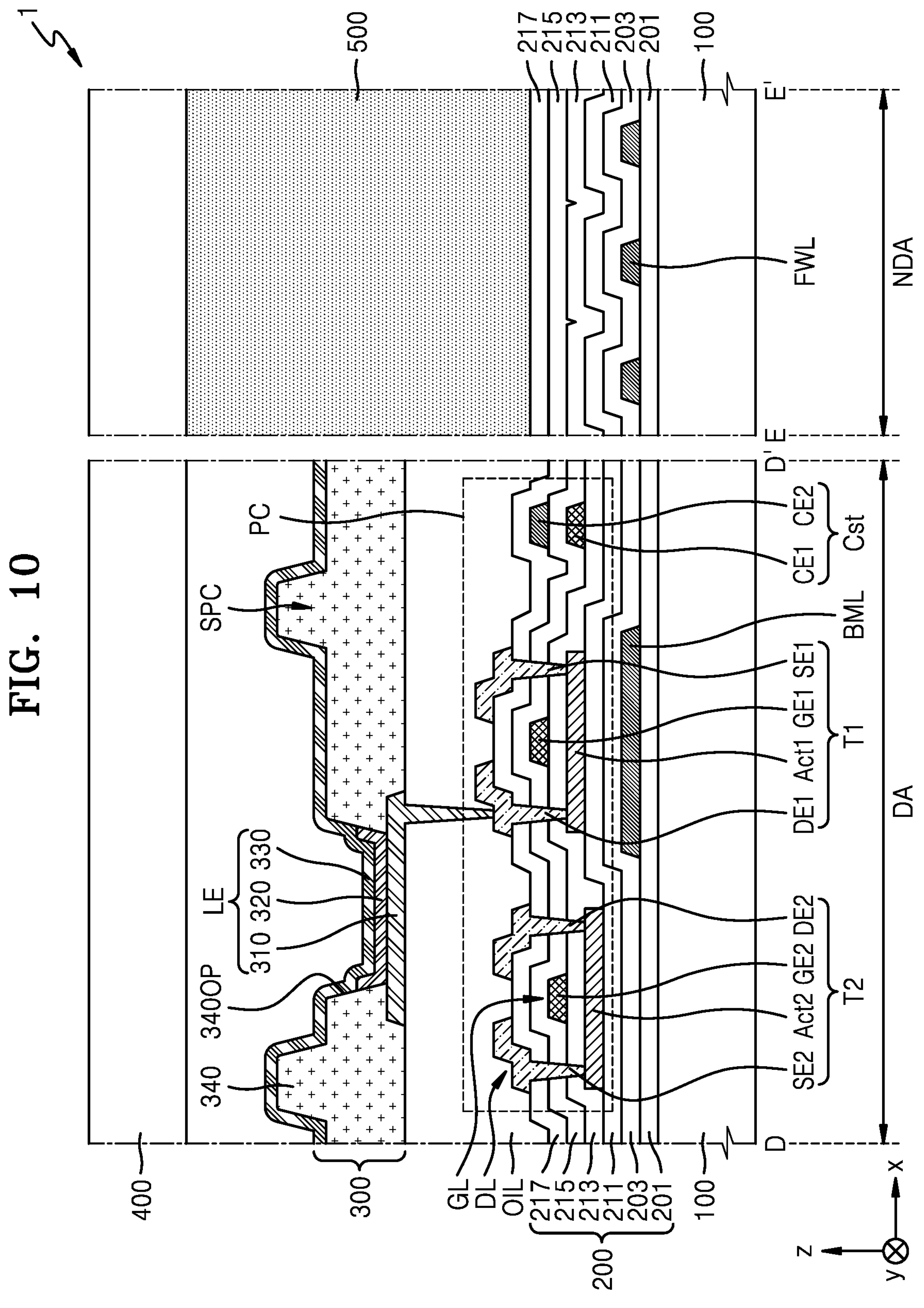
FIG. 10 is a cross-sectional view schematically illustrating a display device taken along line D-D' of FIG. 5 and line E-E' of FIG. 6, according to another alternative embodiment.

FIG. 10 is a cross-sectional view schematically illustrating the display device 1 taken along line D-D' of FIG. 5 and line E-E' of FIG. 6, according to another alternative embodiment. The same or like elements in FIG. 10 as those in FIG. 7 have been labeled with the same reference characters, and any repetitive detailed description thereof will hereinafter be omitted or simplified.

Referring to FIG. 10, an embodiment of the display device 1 may include a substrate 100, an inorganic insulating layer 200, a lower metal layer BML, a pixel circuit PC, a gate wiring GL, a data line DL, an organic insulating layer OIL, a light-emitting element layer 300, a sealing substrate 400, a fanout wiring FWL, and a sealing member 500.

The inorganic insulating layer 200 may be arranged on the substrate 100. The inorganic insulating layer 200 may overlap the display area DA and the non-display area NDA. The inorganic insulating layer 200 may include a first barrier layer 201, a second barrier layer 203, a buffer layer 211, a first inorganic insulating layer 213, a second inorganic insulating layer 215, and a third inorganic insulating layer 217. The first barrier layer 201, the second barrier layer 203, the buffer layer 211, the first inorganic insulating layer 213, the second inorganic insulating layer 215, and the third inorganic insulating layer 217 may be sequentially stacked one on another on the substrate 100. An embodiment shown in FIG. 10 is substantially the same as the embodiment described above with reference to FIG. 7 except for further including the first barrier layer 201, the second barrier layer 203, and the lower metal layer BML.

The first barrier layer 201 may be arranged on the substrate 100. The first barrier layer 201 may include an inorganic insulating material such as silicon nitride ($SiN_x$), silicon oxynitride (SiON), or silicon oxide ($SiO_2$), and may have a single layer or multi-layered structure including the above-described inorganic insulating material.

The second barrier layer 203 may be arranged on the first barrier layer 201. The second barrier layer 203 may include an inorganic insulating material such as silicon nitride ($SiN_x$), silicon oxynitride (SiON), and silicon oxide ($SiO_2$), and may have a single layer or multi-layered structure including the above-described inorganic insulating material. The buffer layer 211 may be arranged on the second barrier layer 203. In some embodiments, at least one selected from the first barrier layer 201 and the second barrier layer 203 may be omitted.

The lower metal layer BML may be arranged between the substrate 100 and the buffer layer 211. In an embodiment, the lower metal layer BML may be arranged between the first barrier layer 201 and the second barrier layer 203. The lower metal layer BML may overlap at least one of the first semiconductor layer Act1 and the second semiconductor layer Act2 in a plan view. In some embodiments, a constant voltage or signal may be applied to the lower metal layer BML. The lower metal layer BML may include Mo.

The pixel circuit PC may include at least one transistor and at least one storage capacitor Cst. In an embodiment, the pixel circuit PC may include a first transistor T1, a second transistor T2, and a storage capacitor Cst. The first transistor T1 may include a first semiconductor layer Act1, a first gate electrode GE1, a first source electrode SE1, and a first drain electrode DE1. The second transistor T2 may include a second semiconductor layer Act2, a second gate electrode GE2, a second source electrode SE2, and a second drain electrode DE2. The storage capacitor Cst may include a first capacitor electrode CE1 and a second capacitor electrode CE2.

At least one selected from the first semiconductor layer Act1 and the second semiconductor layer Act2 may include an oxide semiconductor. The first semiconductor layer Act1 and the second semiconductor layer Act2 may be arranged between the buffer layer 211 and the first inorganic insulating layer 213. In such an embodiment where the lower metal layer BML overlaps at least one selected from the first semiconductor layer Act1 and the second semiconductor layer Act2 including an oxide semiconductor, characteristics of at least one selected from the first transistor T1 and the second transistor T2 may be enhanced.

The fanout wiring FWL may be arranged in the non-display area NDA. The fanout wiring FWL may extend in a direction toward the display area DA from a pad area in a plan view. The fanout wiring FWL may be inserted into the inorganic insulating layer 200. The fanout wiring FWL may be arranged between the substrate 100 and the buffer layer 211. In an embodiment, the fanout wiring FWL may be arranged between the first barrier layer 201 and the second barrier layer 203. The fanout wiring FWL may be arranged in a same layer as the lower metal layer BML and may include a same material as the lower metal layer BML.

The fanout wiring FWL may include a material having a higher melting point than a melting point of the gate wiring GL. The fanout wiring FWL may include Mo, for example. In such an embodiment, even when laser is used in a process of combining the sealing substrate 400 with the sealing member 500, damaging of the fanout wiring FWL may be effectively prevented or substantially reduced.

Figure 11:
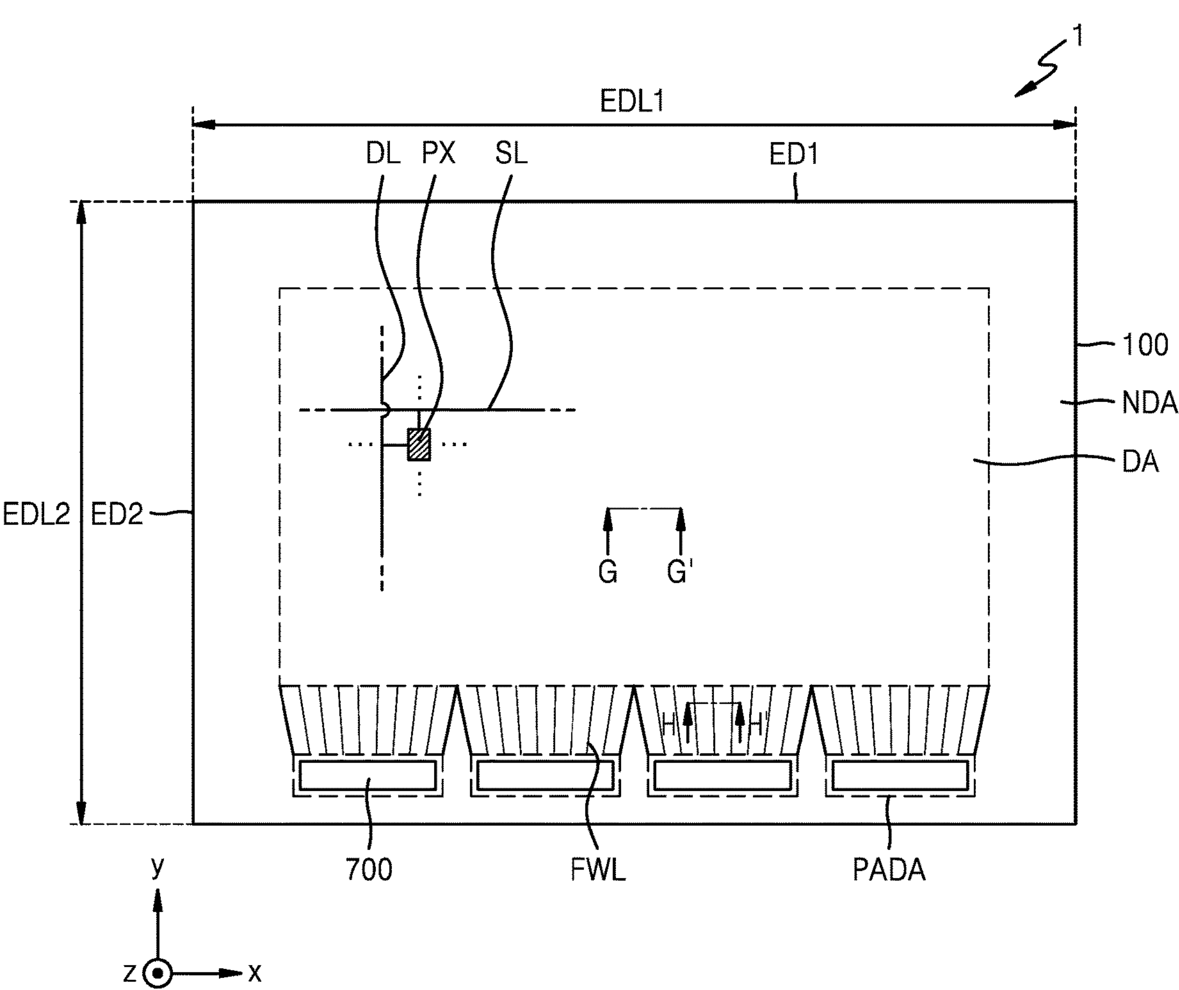
FIG. 11 is a plan view schematically illustrating a display device according to another embodiment.

FIG. 11 is a plan view schematically illustrating a display device 1 according to an alternative embodiment. The same or like elements in FIG. 11 as those in FIG. 3 have been labeled with the same reference characters, and any repetitive detailed description thereof will hereinafter be omitted or simplified.

Referring to FIG. 11, an embodiment of the display device 1 may include a substrate 100, pixels PX, a gate wiring, a data line DL, a fanout wiring FWL, a driving unit 700, and an encapsulation layer. The substrate 100 may have a first edge ED1 and a second edge ED2. The first edge ED1 may extend in a first direction (e.g., an x-direction). The second edge ED2 may extend in a second direction (e.g., a y-direction). In an embodiment, a length EDL1 of the first edge ED1 may be greater than a length EDL2 of the second edge ED2.

The substrate 100 may include a display area DA and a non-display area NDA. The display area DA may be an area in which the display device 1 displays an image. The non-display area NDA may be adjacent to the display area DA. In an embodiment, the non-display area NDA may surround the display area DA.

In an embodiment, an encapsulation layer may overlap the display area DA in a plan view. The encapsulation layer may include at least one inorganic encapsulation layer and at least one organic encapsulation layer. The encapsulation layer may seal a light-emitting element arranged in the display area DA. Hereinafter, the embodiment of FIG. 11 will be described in detail with reference to FIG. 12.

Figure 12:
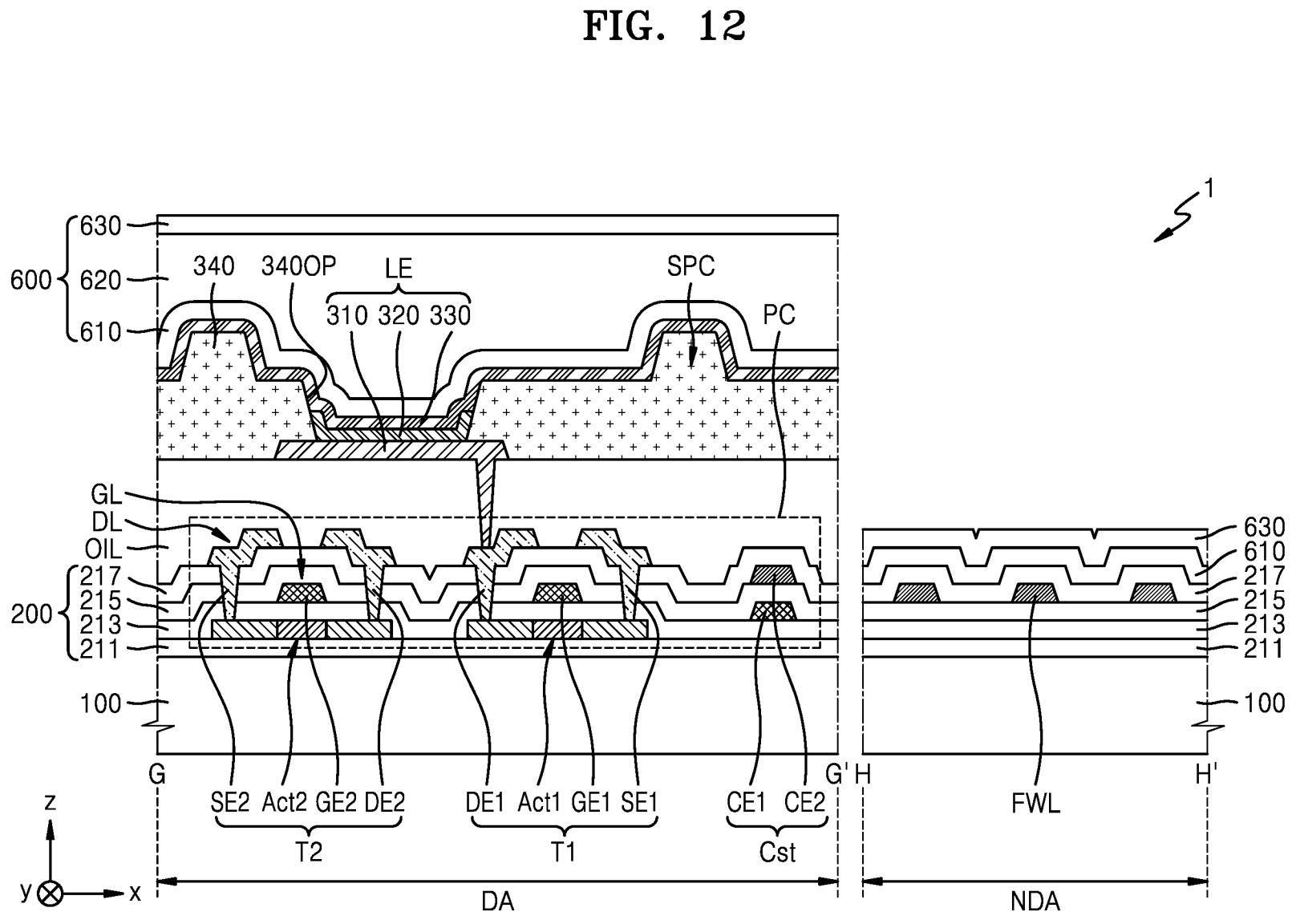

FIG. 12 is a cross-sectional view schematically illustrating a display device 1 taken along line G-G' and line H-H' of FIG. 11, according to an embodiment. The same or like elements in FIG. 12 as those in FIG. 7 have been labeled with the same reference characters, and any repetitive detailed description thereof will hereinafter be omitted or simplified.

Referring to FIG. 12, an embodiment of the display device 1 may include a substrate 100, an inorganic insulating layer 200, a pixel circuit PC, a gate wiring GL, a data line DL, an organic insulating layer OIL, a light-emitting element layer 300, an encapsulation layer 600, and a fanout wiring FWL. The substrate 100 may include a display area DA and a non-display area NDA. An embodiment to be described with reference to FIG. 12 is substantially the same as the embodiment described with reference to FIG. 7 except for the encapsulation layer 600.

The encapsulation layer 600 may be arranged on the light-emitting element layer 300. The encapsulation layer 600 may include at least one inorganic encapsulation layer and at least one organic encapsulation layer. At least one inorganic encapsulation layer and at least one organic encapsulation layer may be alternately stacked one on another. In an embodiment, the encapsulation layer 600 may include a first inorganic encapsulation layer 610, an organic encapsulation layer 620, and a second inorganic encapsulation layer 630, which are sequentially stacked one on another.

The first inorganic encapsulation layer 610, the organic encapsulation layer 620, and the second inorganic encapsulation layer 630 may overlap the display area DA in a plan view. The first inorganic encapsulation layer 610, the organic encapsulation layer 620, and the second inorganic encapsulation layer 630 may be sequentially stacked one on another in the display area DA and may seal the light-emitting element LE.

The first inorganic encapsulation layer 610 and the second inorganic encapsulation layer 630 may extend in the non-display area NDA from the display area DA. The first inorganic encapsulation layer 610 and the second inorganic encapsulation layer 630 may be in contact with each other in the non-display area NDA.

In an embodiment, the gate wiring GL may include a first layer and a second layer. The first layer may include Al. The second layer may be arranged on the first layer. The second layer may include Ti.

In an alternative embodiment, the gate wiring GL may include a first layer, a second layer, and a middle layer. The first layer may include Al. The second layer may be arranged on the first layer. The second layer may include Ti. The middle layer may be arranged between the first layer and the second layer. The middle layer may include TiN.

In an embodiment, the inorganic insulating layer 200 may further include a fourth inorganic insulating layer arranged on the third inorganic insulating layer 217, as in the embodiment described with reference to FIG. 9. In an embodiment, the display device 1 may further include an additional fanout wiring, as in the embodiment described with reference to FIG. 9.

In an embodiment, the inorganic insulating layer 200 may further include a first barrier layer and a second barrier layer, as in the embodiment described with reference to FIG. 10. The display device 1 may further include a lower metal layer, as in the embodiment described with reference to FIG. 10. In such an embodiment, the fanout wiring FWL may be arranged between the substrate 100 and the buffer layer 211.

Figure 13:
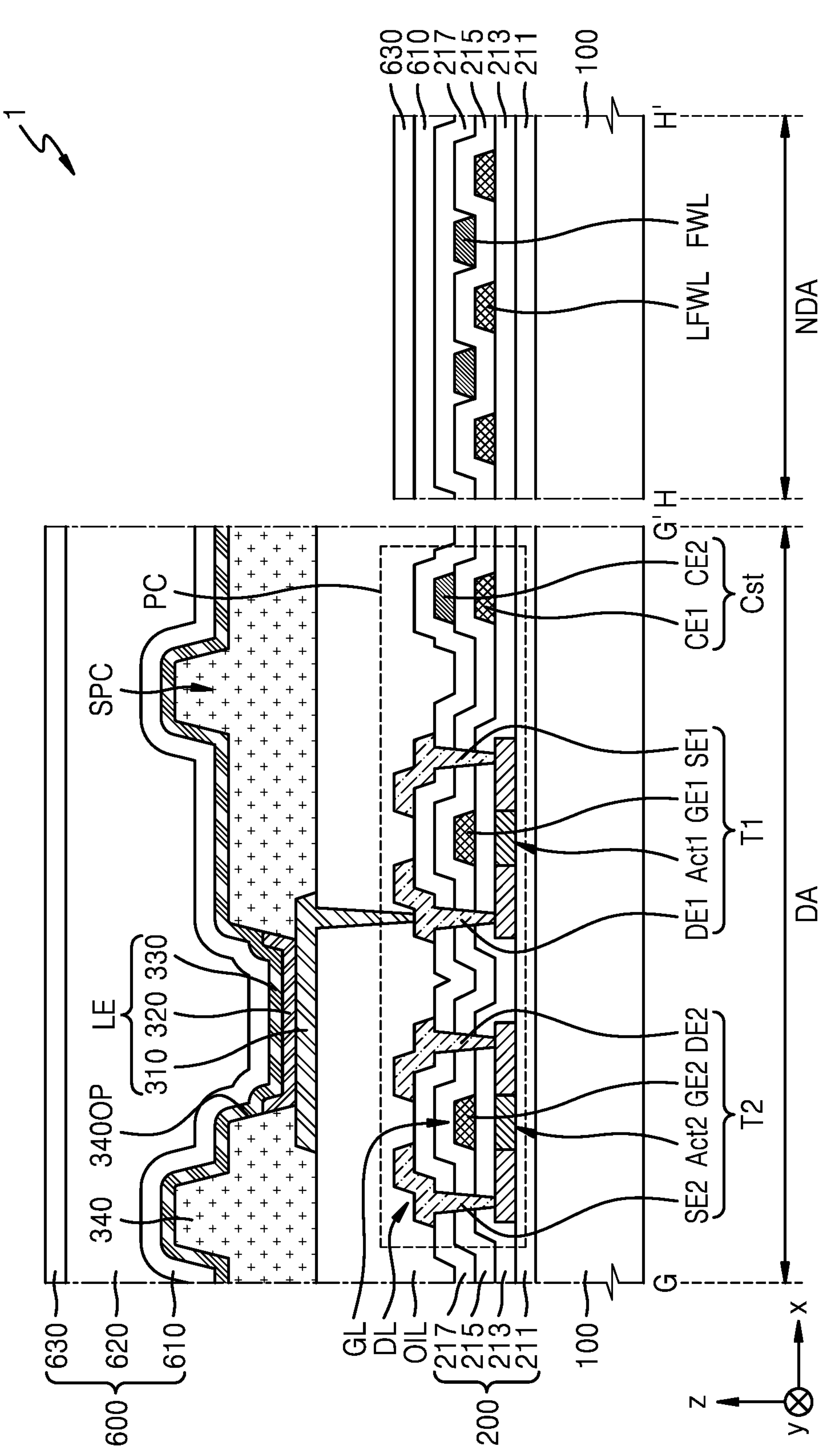
FIG. 13 is a cross-sectional view schematically illustrating a display device taken along line G-G' and line H-H' of FIG. 11, according to an alternative embodiment.

FIG. 13 is a cross-sectional view schematically illustrating a display device 1 taken along line G-G' and line H-H' of FIG. 11, according to an alternative embodiment. The same or like elements in FIG. 13 as those in FIG. 12 have been labeled with the same reference characters, and any repetitive detailed description thereof will hereinafter be omitted or simplified.

Referring to FIG. 13, an embodiment of the display device 1 may include a substrate 100, an inorganic insulating layer 200, a pixel circuit PC, a gate wiring GL, a data line DL, an organic insulating layer OIL, a light-emitting element layer 300, an encapsulation layer 600, a fanout wiring FWL, and a lower fanout wiring LFWL. The substrate 100 may include a display area DA and a non-display area NDA. An embodiment to be described with reference to FIG. 13 is substantially the same as the embodiment described with reference to FIG. 12 except for the lower fanout wiring LFWL.

The lower fanout wiring FWL may be arranged in the non-display area NDA. The lower fanout wiring LFWL may extend in a direction toward the display area DA from a pad area in a plan view. The lower fanout wiring LFWL may be arranged alternating with the fanout wiring FWL in a plan view. In an embodiment, for example, the lower fanout wiring LFWL may be arranged between the adjacent fanout wirings FWL in a plan view. The lower fanout wiring LFWL may include a same material as a material of the gate wiring GL. In an embodiment, for example, the lower fanout wiring LFWL may include Al. In an embodiment where the display device 1 includes the encapsulation layer 600, a process of combining a sealing substrate with a sealing member may be omitted. In such an embodiment, even when the lower fanout wiring LFWL includes a material having a low melting point, the lower fanout wiring LFWL may not be damaged.

As described above, embodiments of the display device according to the invention may include a gate wiring that is arranged between a first inorganic insulating layer and a second inorganic insulating layer, overlaps a display area in a plan view and has a low resistance. Thus, because the response speed of the display device is increased, the display quality of the display device may be increased.

In such embodiments, the gate wiring and a fanout wiring may include different materials from each other. In an embodiment, for example, the gate wiring may include a material for providing a low sheet resistance, and the fanout wiring may include a material having a high melting point. Thus, the reliability of the display device may be increased.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a substrate comprising a display area and a non-display area outside the display area, wherein the non-display area comprises a pad area;

an inorganic insulating layer disposed on the substrate;

a gate wiring overlapping the display area in a plan view, extending in a first direction and disposed inside the inorganic insulating layer;

a fanout wiring extending in a direction toward the display area from the pad area in the plan view, disposed inside the inorganic insulating layer and comprising a different material from a material of the gate wiring;

a light-emitting element layer disposed on the inorganic insulating layer and comprising a light-emitting element overlapping the display area in the plan view;

a sealing substrate disposed on the light-emitting element layer; and a sealing member disposed between the substrate and the sealing substrate and surrounding the display area in the plan view, wherein a sheet resistance of the gate wiring is lower than a sheet resistance of the fanout wiring, wherein the fanout wiring extends while crossing the sealing member in the plan view, and a melting point of a material included in the fanout wiring is higher than a melting point of a material included in the gate wiring, wherein the sealing member comprises a laser-curable material, and wherein the inorganic insulating layer comprises a buffer layer, a first inorganic insulating layer, and a second inorganic insulating layer, which are sequentially stacked one on another, and the display device further comprises:

a lower metal layer overlapping the display area in the plan view and disposed between the substrate and the buffer layer; and a semiconductor layer overlapping the lower metal layer in the plan view, disposed between the buffer layer and the first inorganic insulating layer and comprising an oxide semiconductor, and the fanout wiring is arranged in a same layer as the lower metal layer.

2. The display device of claim 1, wherein the sheet resistance of the gate wiring is less than or equal to about a half of the sheet resistance of the fanout wiring.

3. The display device of claim 1, wherein the gate wiring comprises at least one selected from titanium nitride and titanium and aluminum, and the fanout wiring comprises molybdenum.

4. The display device of claim 1, wherein the gate wiring is disposed between the first inorganic insulating layer and the second inorganic insulating layer, and the fanout wiring is disposed between the substrate and the buffer layer.

5. The display device of claim 1, wherein the substrate comprises a first edge extending in the first direction and a second edge extending in a second direction crossing the first direction, and a length of the first edge is greater than a length of the second edge.

6. The display device of claim 1, wherein the fanout wiring comprises adjacent fanout wirings, and the adjacent fanout wirings are disposed in a same layer as each other.

7. The display device of claim 1, further comprising:

an encapsulation layer disposed on the light-emitting element layer and comprising an inorganic encapsulation layer and an organic encapsulation layer.

* * * * *